(12) United States Patent
Fukushima et al.

(10) Patent No.: US 11,864,389 B2
(45) Date of Patent: Jan. 2, 2024

(54) SEMICONDUCTOR MEMORY DEVICE

(71) Applicant: Kioxia Corporation, Tokyo (JP)

(72) Inventors: Takashi Fukushima, Yokkaichi (JP); Toshiyuki Sasaki, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 315 days.

(21) Appl. No.: 17/400,627

(22) Filed: Aug. 12, 2021

(65) Prior Publication Data
US 2022/0085046 A1 Mar. 17, 2022

(30) Foreign Application Priority Data
Sep. 17, 2020 (JP) .................................. 2020-156255

(51) Int. Cl.
*H10B 43/30* (2023.01)
*H10B 41/30* (2023.01)
(52) U.S. Cl.
CPC ............. *H10B 43/30* (2023.02); *H10B 41/30* (2023.02)
(58) Field of Classification Search
CPC ........ H10B 43/30; H10B 41/30; H10B 43/27; H10B 41/27; H10B 41/35; H10B 41/50; H10B 43/35; H10B 43/50
See application file for complete search history.

(56) References Cited

U.S. PATENT DOCUMENTS

| | | | | |
|---|---|---|---|---|
| 9,847,345 | B2* | 12/2017 | Mori | H10B 43/10 |
| 9,876,028 | B2* | 1/2018 | Konagai | H10B 43/27 |
| 10,121,796 | B2* | 11/2018 | Sonehara | H10B 43/50 |
| 10,672,782 | B2 | 6/2020 | Utsumi | |

FOREIGN PATENT DOCUMENTS

| | | |
|---|---|---|
| JP | 2018-26518 A | 2/2018 |
| TW | 201939727 A | 10/2019 |
| TW | 202011581 A | 3/2020 |
| TW | 202032769 A | 9/2020 |

* cited by examiner

*Primary Examiner* — Allison Bernstein
(74) *Attorney, Agent, or Firm* — Oblon, McClelland, Maier & Neustadt, L.L.P.

(57) ABSTRACT

A semiconductor memory device includes a substrate; a plurality of first conductive layers and first insulating layers stacked in alternation; a first semiconductor layer opposed to first conductive layers and first insulating layers; a second semiconductor layer; a second insulating layer that covers outer peripheral surface of the first semiconductor layer; and a third insulating layer disposed at a position different from first conductive layers, first insulating layers, and the second insulating layer, the third insulating layer having one end in contact with the second semiconductor, the third insulating layer having another end farther from the second semiconductor layer than the second insulating layer. A metal oxide film is disposed on a surface on the third insulating layer side of the second insulating layer. A metal oxide film is absent on a surface on the third insulating layer side of the plurality of first insulating layers.

18 Claims, 37 Drawing Sheets

SEMICONDUCTOR MEMORY DEVICE

CROSS-REFERENCE TO RELATED APPLICATIONS

This application is based upon and claims the benefit of Japanese Patent Application No. 2020-156255, filed on Sep. 17, 2020, the entire contents of which are incorporated herein by reference.

BACKGROUND

Field

Embodiments described herein relate generally to a semiconductor memory device.

Description of the Related Art

There has been known a semiconductor memory device that includes a semiconductor substrate, a plurality of conductive layers stacked in a direction intersecting with a surface of the semiconductor substrate, a semiconductor column extending in a direction intersecting with the surface of the semiconductor substrate and opposed to the plurality of conductive layers, and a gate insulating film disposed between the conductive layers and the semiconductor column.

DETAILED DESCRIPTION

Figure 1:
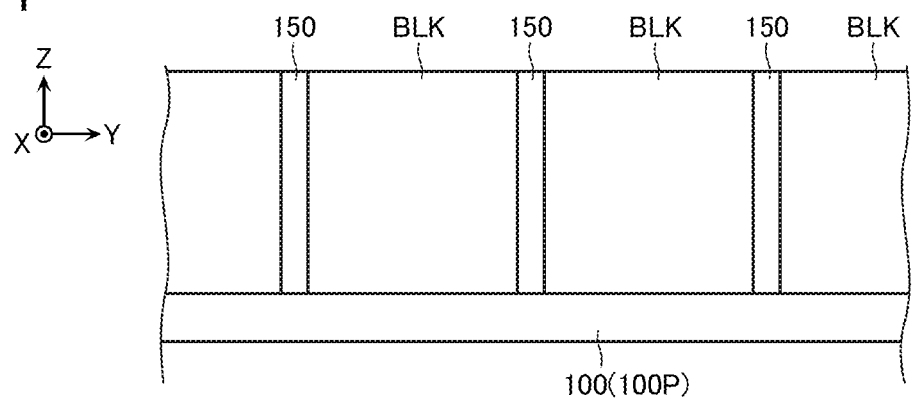
FIG. 1 is a schematic cross-sectional view of a semiconductor memory device according to a first embodiment.

A semiconductor memory device according to one embodiment comprises: a substrate; a plurality of first conductive layers and a plurality of first insulating layers stacked in alternation in a first direction intersecting with a surface of the substrate; a first semiconductor layer that extends in the first direction and is opposed to the plurality of first conductive layers and the plurality of first insulating layers; a second semiconductor layer that is connected to one end portion in the first direction of the first semiconductor layer and extends in a second direction intersecting with the first direction; a second insulating layer that covers an outer peripheral surface of another end portion of the first semiconductor layer; and a third insulating layer disposed at a position in the second direction different from the plurality of first conductive layers, the plurality of first insulating layers, and the second insulating layer, the third insulating layer extending in the first direction, the third insulating layer having one end in the first direction in contact with the second semiconductor, the third insulating layer having another end in the first direction farther from the second semiconductor layer than the second insulating layer. A metal oxide film is disposed on a surface on the third insulating layer side in the second direction of the second insulating layer. A metal oxide film is absent on a surface on the third insulating layer side in the second direction of the plurality of first insulating layers.

Next, the semiconductor memory devices according to embodiments are described in detail with reference to the drawings. The following embodiments are only examples, and not described for the purpose of limiting the present invention.

In this specification, a direction parallel to a surface of the semiconductor substrate is referred to as an X-direction, a direction parallel to the surface of the semiconductor substrate and perpendicular to the X-direction is referred to as a Y-direction, and a direction perpendicular to the surface of the semiconductor substrate is referred to as a Z-direction.

In this specification, a direction along a predetermined plane is referred to as a first direction, a direction intersecting with the first direction along this predetermined plane is referred to as a second direction, and a direction intersecting with this predetermined plane is referred to as a third direction in some cases. These first direction, second direction, and third direction may correspond to any of the X-direction, the Y-direction, and the Z-direction and need not to correspond to these directions.

Expressions such as "above" and "below" in this specification are based on the semiconductor substrate. For example, a direction away from the semiconductor substrate along the Z-direction is referred to as above and a direction approaching the semiconductor substrate along the Z-direction is referred to as below. A lower surface and a lower end portion of a certain configuration mean a surface and an end portion on the semiconductor substrate side of this configuration. An upper surface and an upper end portion of a certain configuration mean a surface and an end portion on a side opposite to the semiconductor substrate of this configuration. A surface intersecting with the X-direction or the Y-direction is referred to as a side surface and the like.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the first configuration is disposed on a current path between the second configuration and the third configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like is turned ON.

First Embodiment

The configuration of the semiconductor memory device according to the first embodiment is described with reference to the drawings. Note that the following drawings are schematic, and the configurations are partially omitted in some cases for sake of convenience of the description.

[Structure]

Figure 2:
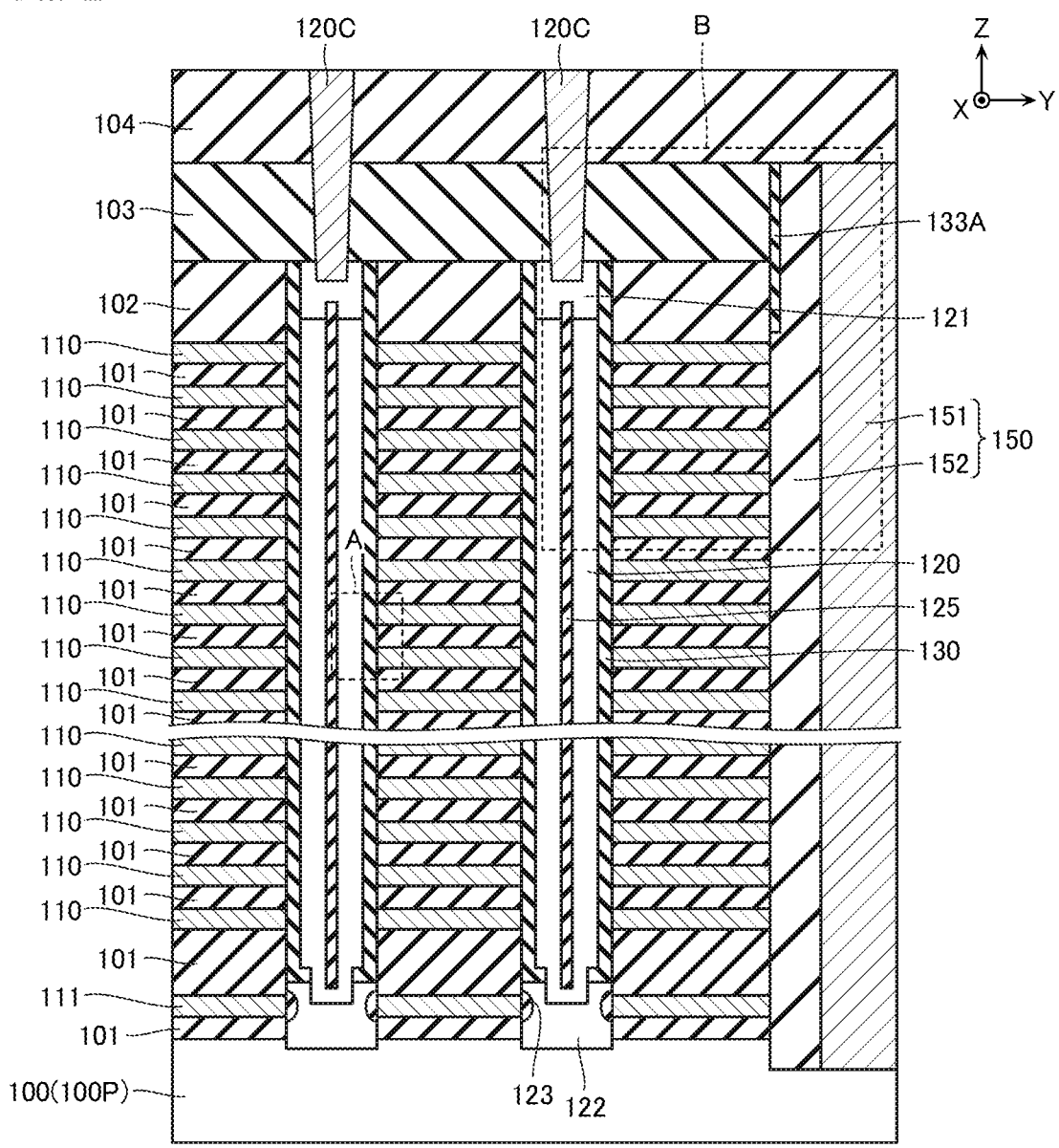
FIG. 2 is a schematic cross-sectional view of the semiconductor memory device according to the first embodiment.
Figure 3:
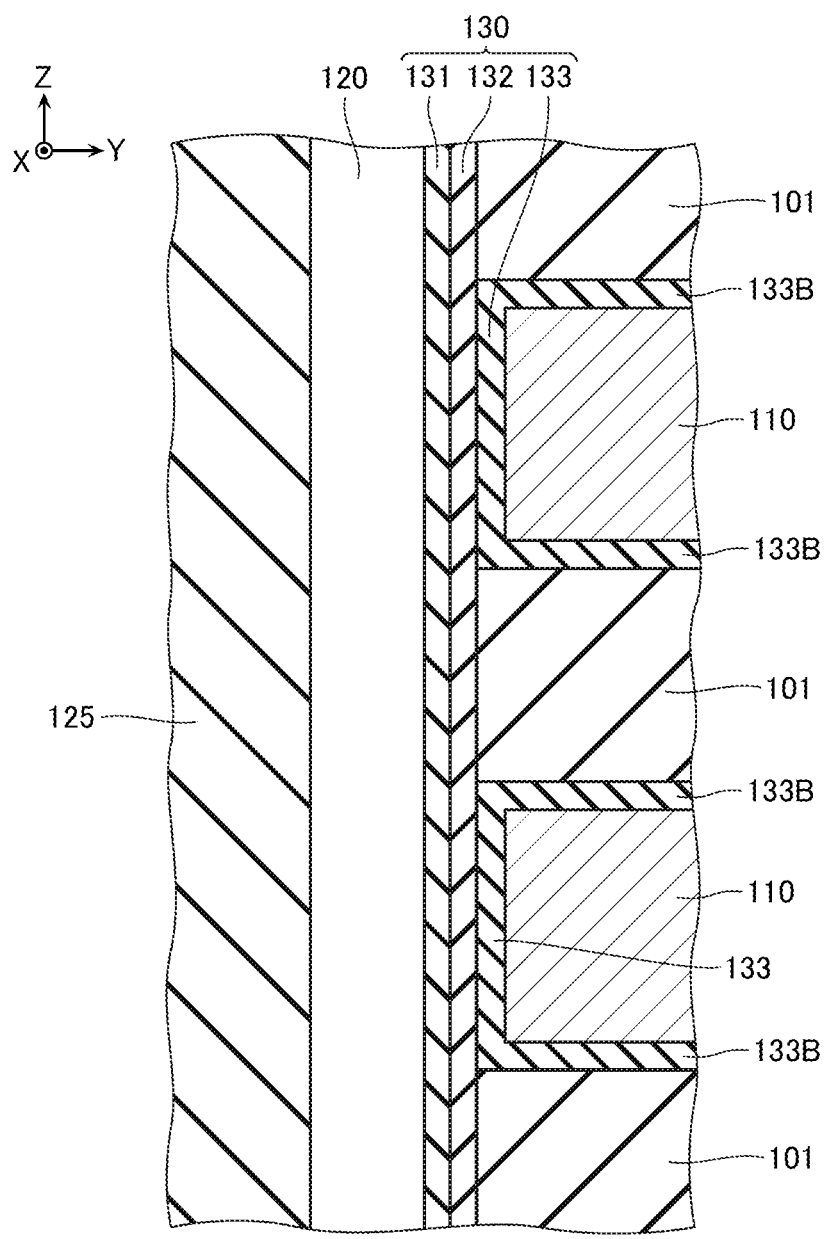
FIG. 3 is a schematic enlarged cross-sectional view of a part indicated by A in FIG. 2.
Figure 4:
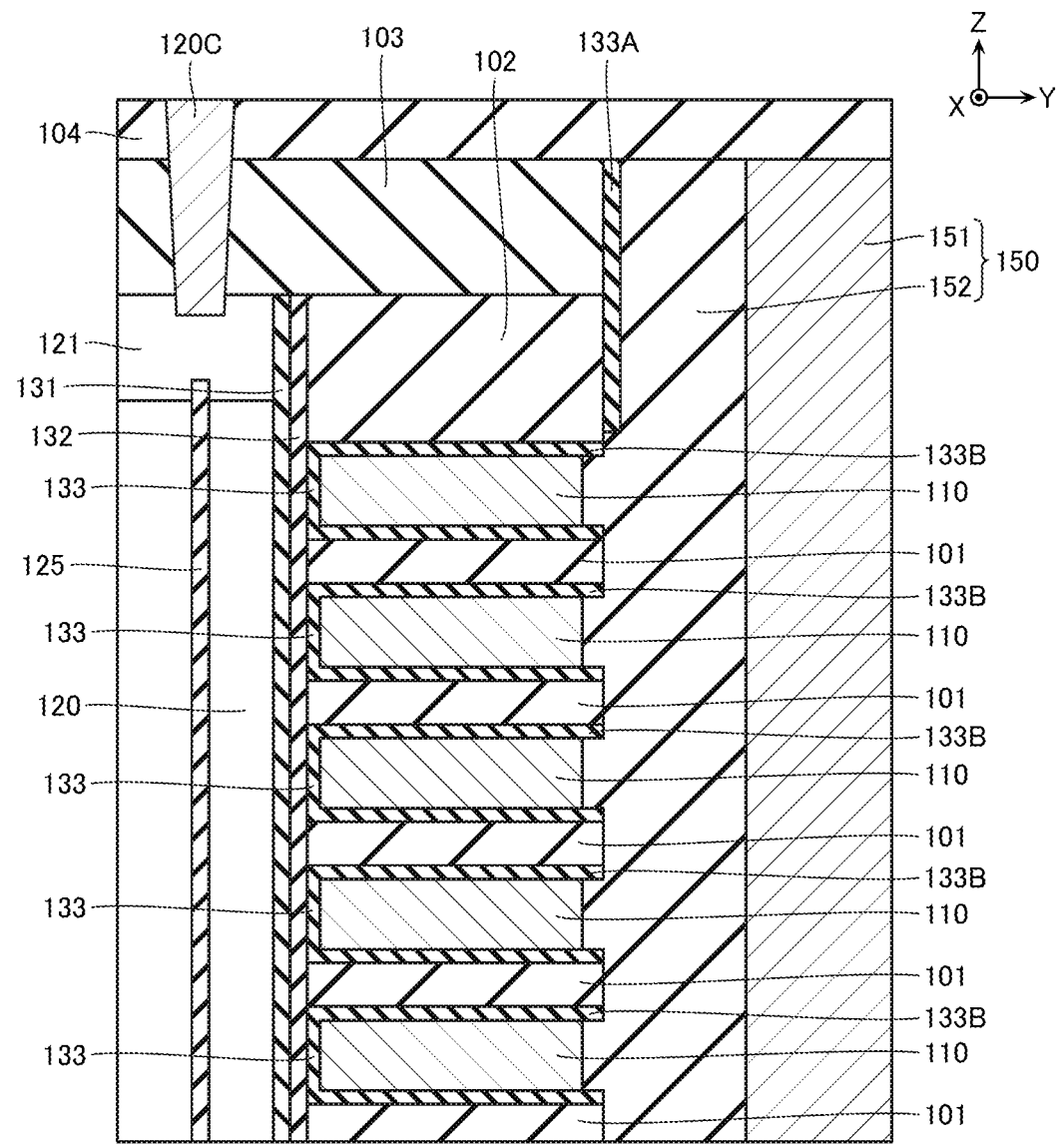
FIG. 4 is a schematic enlarged cross-sectional view of a part indicated by B in FIG. 2.

FIG. 1 is a schematic cross-sectional view of the semiconductor memory device according to the first embodiment. FIG. 2 is a schematic cross-sectional view of the semiconductor memory device according to the first embodiment. FIG. 3 is a schematic enlarged cross-sectional view of a part indicated by A in FIG. 2. FIG. 4 is a schematic enlarged cross-sectional view of a part indicated by B in FIG. 2. FIG. 3 and FIG. 4 also illustrate members not illustrated in FIG. 2.

[Structure of Semiconductor Memory Device]

As illustrated in FIG. 1, the semiconductor memory device according to this embodiment includes a semiconductor substrate 100 and a plurality of memory blocks BLK and inter-block structures 150 disposed in alternation in the Y-direction above the semiconductor substrate 100.

For example, as illustrated in FIG. 2, the memory block BLK includes a plurality of conductive layers 110 and a plurality of insulating layers 101 stacked in alternation in the Z-direction, semiconductor columns 120 that extend in the Z-direction and are opposed to the plurality of conductive layers 110 and the plurality of insulating layers 101, insulating layers 102 that cover outer peripheral surfaces of upper end portions of the semiconductor columns 120, and an etching stopper 133A.

[Structure of Semiconductor Substrate 100]

The semiconductor substrate 100 illustrated in FIG. 1 and FIG. 2 is, for example, a semiconductor substrate made of P-type silicon (Si) containing P-type impurities such as boron (B). For example, in the surface of the semiconductor substrate 100, an N-type well region (not illustrated) containing N-type impurities, such as phosphorus (P), a P-type well region 100P containing P-type impurities, such as boron (B), a semiconductor substrate region (not illustrated) where the N-type well region or the P-type well region 100P is absent, and an insulating region (not illustrated) are disposed.

[Structures of Conductive Layer 110 and Insulating Layer 101]

The conductive layer 110 is a substantially plate-shaped conductive layer extending in the X-direction. The conductive layer 110 is a metal film of molybdenum (Mo) in this embodiment, but may be a metal film of tungsten (W), ruthenium (Ru), or the like. Between the plurality of conductive layers 110 arranged in the Z-direction, the insulating layers 101 of silicon oxide ($SiO_2$) or the like are disposed. For example, as illustrated in FIG. 3, between the conductive layer 110 and the insulating layer 101, an insulating film 133B that contains aluminum oxide ($Al_2O_3$) or another metal oxide film is disposed.

The plurality of conductive layers 110 are electrically independent in every memory block BLK and each function as a word line, a select gate line, or the like.

A conductive layer 111 is disposed below the conductive layer 110. The conductive layer 111 is a metal film of molybdenum (Mo) in this embodiment, but may be a metal film of tungsten (W), ruthenium (Ru), or the like. Between the conductive layer 111 and the conductive layer 110, the insulating layer 101 of silicon oxide ($SiO_2$) or the like is disposed. Although the illustration is omitted, between the conductive layer 110 and the insulating layer 101, the insulating film 133B that contains aluminum oxide ($Al_2O_3$) or another metal oxide film is disposed.

The conductive layer 111 functions as the select gate line or the like. The conductive layers 111 are electrically independent in every memory block BLK.

[Structure of Semiconductor Column 120]

As illustrated in FIG. 2, the semiconductor columns 120 extend in the Z-direction and are arranged in a predetermined pattern in the X-direction and the Y-direction. The semiconductor columns 120 function as channel regions of a plurality of memory cells and a select transistor.

The semiconductor column 120 is a semiconductor layer of polycrystalline silicon (Si) or the like. The semiconductor column 120 has a substantially closed-bottomed cylindrical shape and includes an insulating layer 125 of silicon oxide or the like in the center part. The outer peripheral surfaces of the semiconductor columns 120 are each surrounded by the plurality of conductive layers 110 and the plurality of insulating layers 101 and opposed to the plurality of conductive layers 110 and the plurality of insulating layers 101.

An impurity region 121 containing N-type impurities, such as phosphorus (P), is disposed on the upper end portion of the semiconductor column 120. The impurity region 121 is connected to a bit line via a contact 120C or the like.

The semiconductor column 120 has a lower end portion connected to the P-type well region 100P of the semiconductor substrate 100 via a semiconductor layer 122 made of single-crystal silicon (Si) or the like. The semiconductor layer 122 functions as the channel region of the select transistor. The semiconductor layer 122 has an outer peripheral surface surrounded by the conductive layer 111 and opposed to the conductive layer 111. An insulating layer 123 of silicon oxide or the like is disposed between the semiconductor layer 122 and the conductive layer 111.

A gate insulating film 130 has a substantially cylindrical shape that covers the outer peripheral surface of the semiconductor column 120.

For example, as illustrated in FIG. 3 and FIG. 4, the gate insulating film 130 includes a tunnel insulating film 131, an electric charge accumulating film 132, and a block insulating film 133 stacked between the semiconductor column 120 and the conductive layers 110. The tunnel insulating film 131 is an insulating film, such as silicon oxide ($SiO_2$), the electric charge accumulating film 132 is a film, such as silicon nitride ($Si_3N_4$), that can accumulate electric charges, and the block insulating film 133 is, for example, an insulating film that contains aluminum oxide ($Al_2O_3$) or another metal oxide film. The tunnel insulating film 131 and the electric charge accumulating film 132 have substantially cylindrical shapes and extend in the Z-direction along the outer peripheral surface of the semiconductor column 120. The block insulating film 133 is disposed on an opposed surface of the conductive layer 110 with the semiconductor column 120 and continuously formed with the insulating film 133B formed on the upper surface and the lower surface of the conductive layer 110. The block insulating film 133 has a substantially cylindrical shape and is opposed to the outer peripheral surface of the semiconductor column 120 via the tunnel insulating film 131 and the electric charge accumulating film 132.

FIG. 3 and FIG. 4 illustrate an example in which the gate insulating film 130 includes the electric charge accumulating film 132 of silicon nitride or the like. However, the gate insulating film 130 may include, for example, a floating gate of polycrystalline silicon containing the N type or P type impurities, or the like.

[Structure of Insulating Layer 102]

As illustrated in FIG. 2 and FIG. 4, the upper surface of the stacked body, which is formed by stacking the plurality of conductive layers 110 and the plurality of insulating layers 101 in alternation in the Z-direction, is covered with the insulating layer 102. The insulating layer 102 is made of silicon oxide ($SiO_2$) or the like. This insulating layer 102 covers the outer peripheral surface of the upper end portion of the semiconductor column 120 via the gate insulating film 130 (the tunnel insulating film 131 and the electric charge accumulating film 132).

Note that the upper surfaces of the insulating layers 102 and the semiconductor columns 120 are covered with insulating layers 103 of silicon oxide ($SiO_2$) or the like.

[Structure of Inter-Block Structure 150]

As described with reference to FIG. 1, the inter-block structure 150 is disposed between the two memory blocks BLK adjacent in the Y-direction and extend in the Z-direction and the X-direction. For example, as illustrated in FIG. 2 and FIG. 4, the inter-block structure 150 includes a conductive layer 151 that extends in the Z-direction and the X-direction and an insulating layer 152 disposed on the side surface of the conductive layer 151. The conductive layer 151 is formed of a conductive layer of tungsten (W) or the like. The insulating layer 152 is formed of an insulating layer of silicon oxide ($SiO_2$) or the like. This insulating layer 152 ensures insulation between the conductive layer 151 and the plurality of stacked conductive layers 110.

The conductive layer 151 in the inter-block structure 150 has a lower end connected to the P-type well region 100P of the semiconductor substrate 100 to function as a source contact. Between the conductive layer 151 and the P-type well region 100P, silicide, an N-type impurity layer, or the like may be disposed.

The insulating layer 152 in the inter-block structure 150 has a lower end in contact with the P-type well region 100P of the semiconductor substrate 100. The insulating layer 152 in the inter-block structure 150 has a height in the Z-direction higher than that of the upper surface of the insulating layer 102. In this embodiment, the height in the Z-direction of the insulating layer 152 is substantially equal to a height of the upper surface of the insulating layer 103.

Upper surfaces of the insulating layer 103 and the inter-block structure 150 are covered with insulating layers 104 of silicon oxide ($SiO_2$) or the like.

[Structure of Etching Stopper 133A]

As illustrated in FIG. 2 and FIG. 4, the etching stopper 133A is disposed on the side surface on the inter-block structure 150 side among side surfaces in the Y-direction of the insulating layer 102 and the insulating layer 103. This etching stopper 133A is an insulating film containing, for example, aluminum oxide ($Al_2O_3$) or another metal oxide film. An etching rate under a predetermined condition of this etching stopper 133A is lower (an etching resistance under the predetermined condition is higher) than those of the insulating layers 102, 103 made of silicon oxide ($SiO_2$) or the like.

[First Manufacturing Method of Semiconductor Memory Device According to First Embodiment]

Next, with reference to FIG. 5 to FIG. 16, a part of the first manufacturing method of the semiconductor memory device according to the first embodiment will be described.

Figure 5:
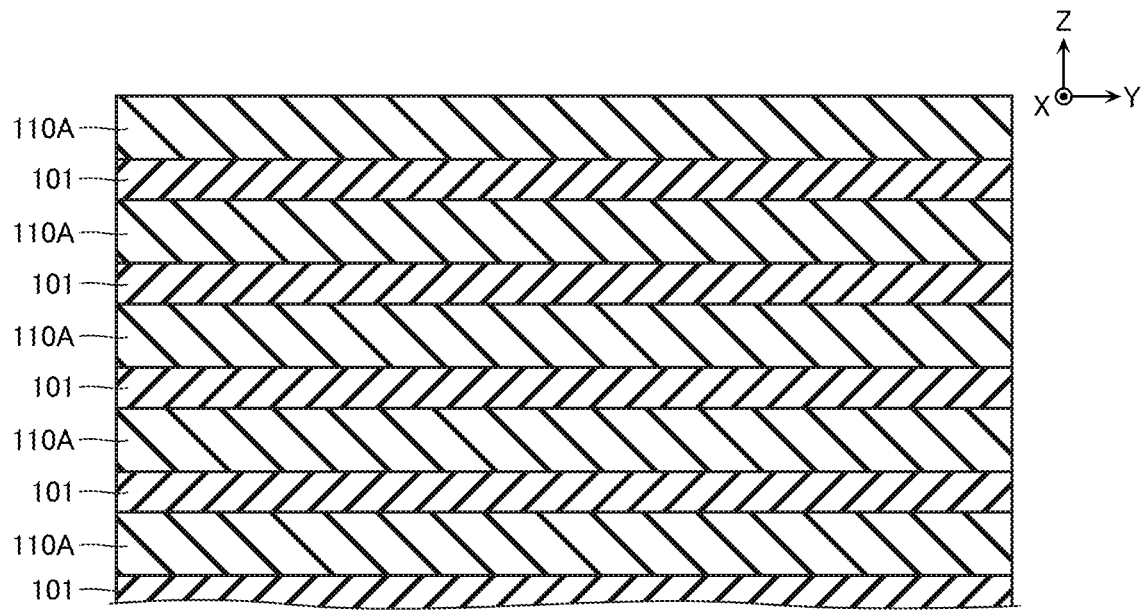
FIG. 5 is a schematic Y-Z cross-sectional view illustrating a first manufacturing method of the semiconductor memory device according to the first embodiment.

First, as illustrated in FIG. 5, on the semiconductor substrate 100 (not illustrated), the plurality of insulating layers 101 and sacrifice layers 110A are stacked in alternation. The sacrifice layer 110A is made of silicon nitride ($Si_3N_4$) or the like. The insulating layer 101 and the sacrifice layer 110A are formed by Chemical Vapor Deposition (CVD) or the like.

Figure 6:
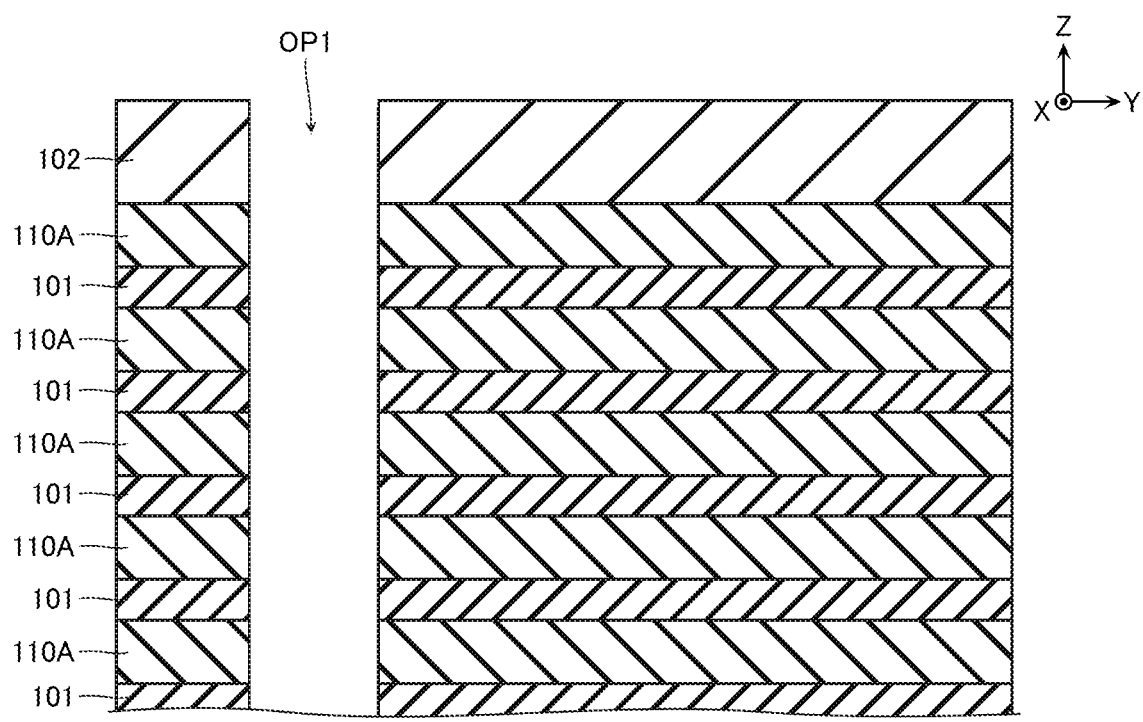
FIG. 6 is a schematic Y-Z cross-sectional view illustrating the first manufacturing method of the semiconductor memory device according to the first embodiment.

Next, as illustrated in FIG. 6, an opening OP1 is formed at a position corresponding to the semiconductor column 120. The opening OP1 is a through-hole that extends in the Z-direction and penetrates the insulating layers 101 and the sacrifice layers 110A to expose the upper surface of the semiconductor substrate 100 (not illustrated). For example, the opening OP1 can be formed by forming the insulating layer 102 having an opening at a part corresponding to the opening OP1 on the upper surface of the plurality of stacked insulating layers 101 and sacrifice layers 110A and performing Reactive Ion Etching (RIE) using the insulating layer 102 as a mask.

Figure 7:
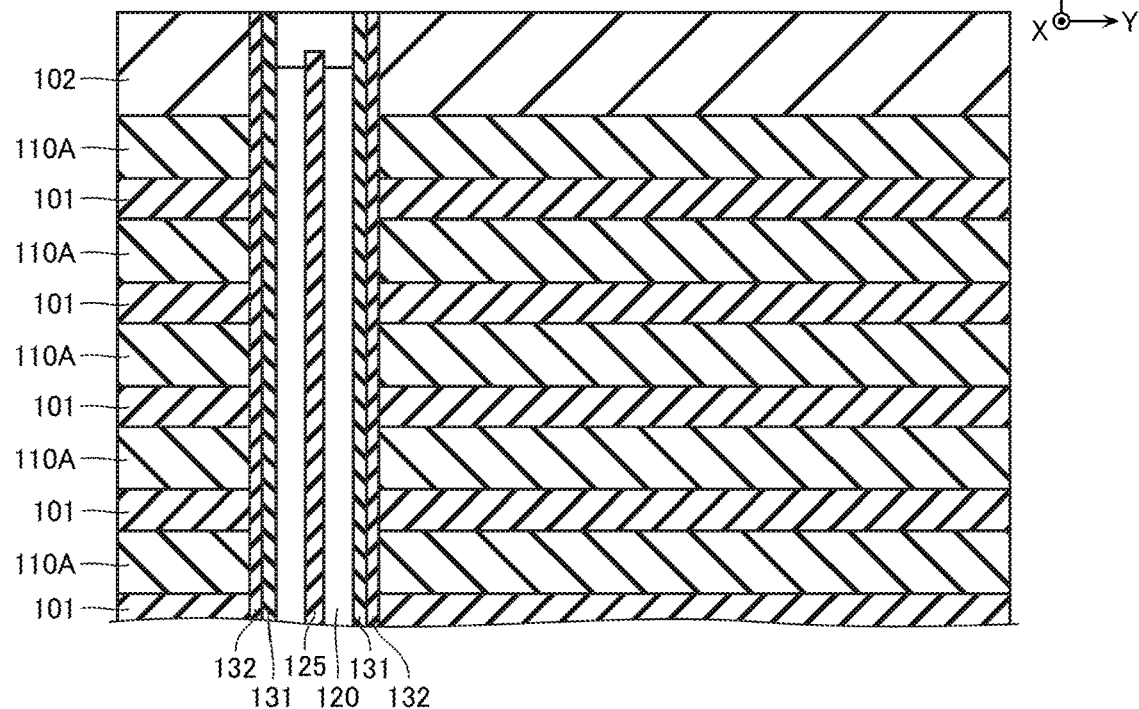
FIG. 7 is a schematic Y-Z cross-sectional view illustrating the first manufacturing method of the semiconductor memory device according to the first embodiment.

Next, as illustrated in FIG. 7, the electric charge accumulating film 132, the tunnel insulating film 131, and the semiconductor column 120 are formed inside the opening OP1 and further the insulating layer 125 and the like is formed.

Figure 8:
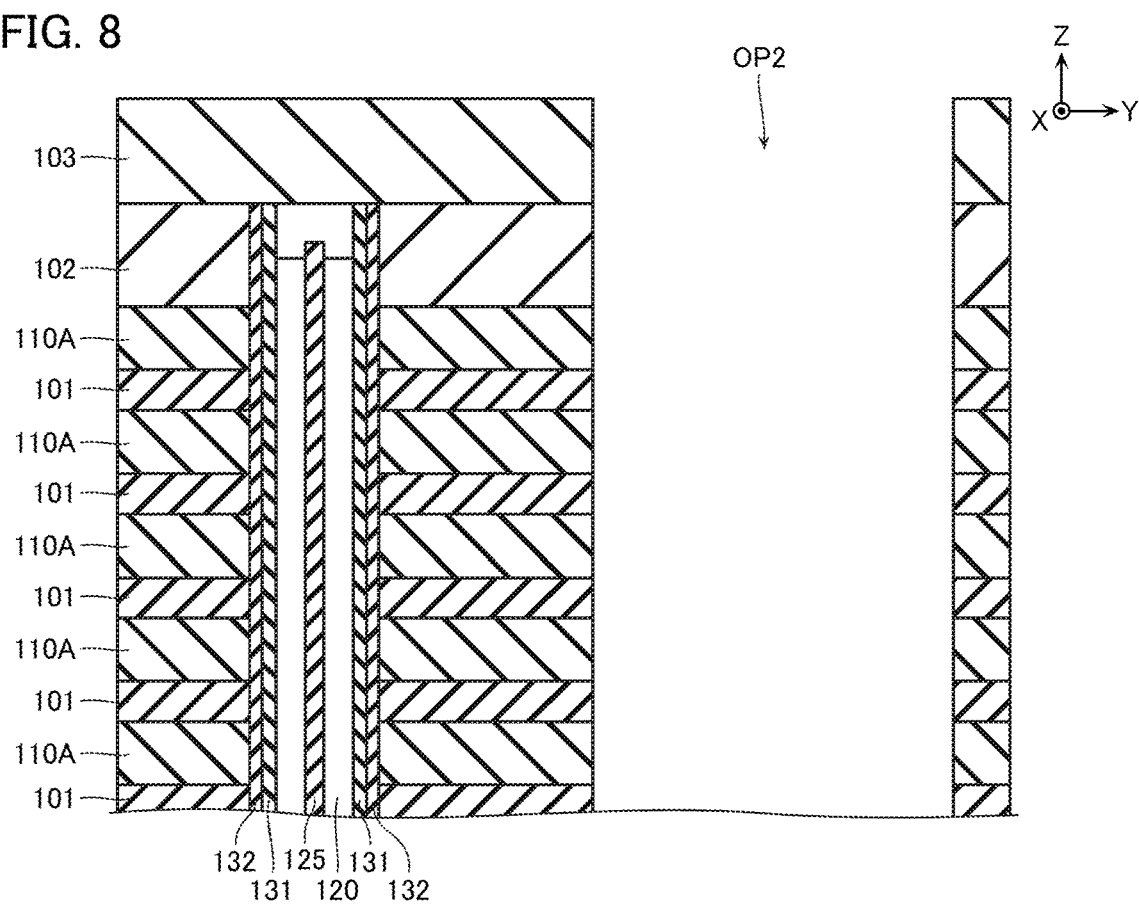
FIG. 8 is a schematic Y-Z cross-sectional view illustrating the first manufacturing method of the semiconductor memory device according to the first embodiment.

Next, as illustrated in FIG. 8, an opening OP2 is formed at a position corresponding to the inter-block structure 150. The opening OP2 is a trench that extends in the Z-direction and the X-direction, penetrates the insulating layers 101 and the sacrifice layers 110A, and separates them in the Y-direction to expose the upper surface of the semiconductor substrate 100 (not illustrated). The opening OP2 can be formed by, for example, forming the insulating layer 103 having a trench at a part corresponding to the opening OP2 on the upper surface of the insulating layer 102 and performing RIE using the insulating layer 103 as a mask.

Figure 9:
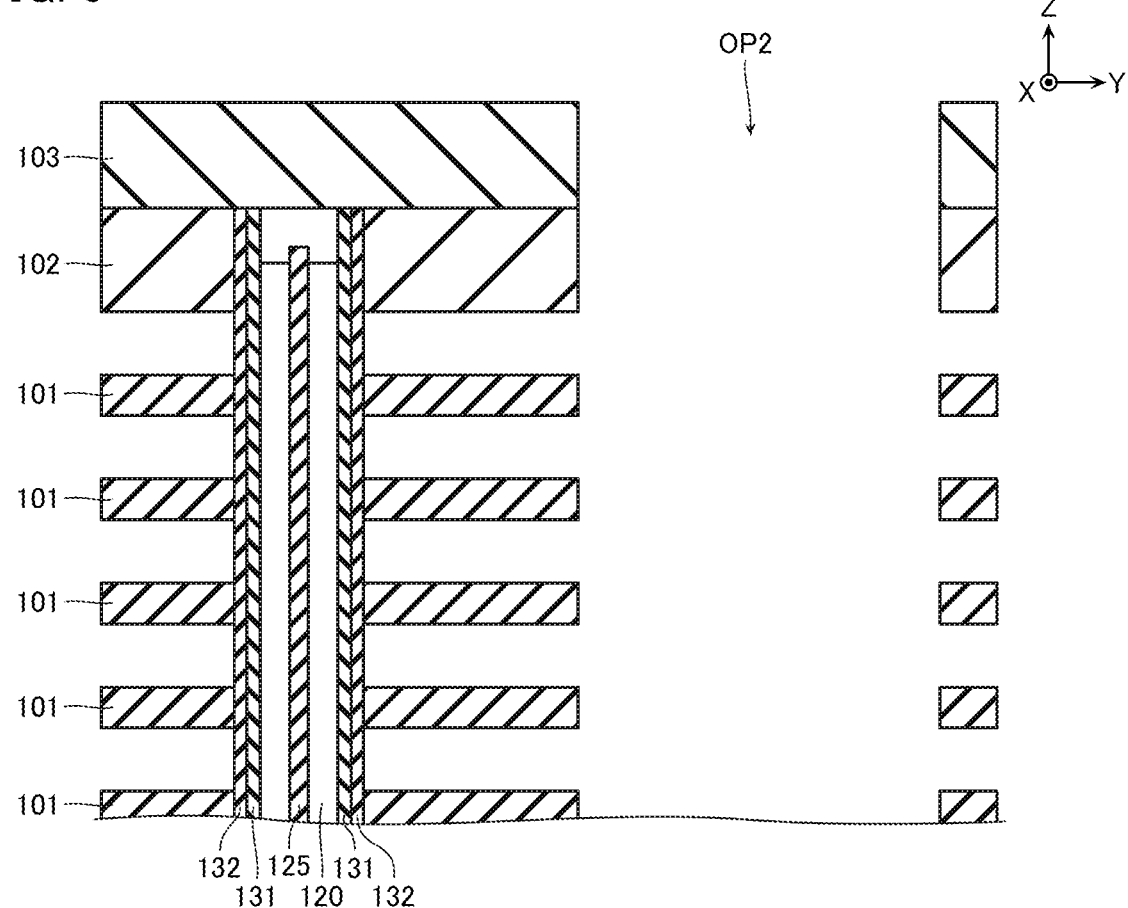
FIG. 9 is a schematic Y-Z cross-sectional view illustrating the first manufacturing method of the semiconductor memory device according to the first embodiment.

Next, as illustrated in FIG. 9, the sacrifice layers 110A are removed via the opening OP2. The sacrifice layer 110A is removed by wet etching using phosphoric acid or the like.

Figure 10:
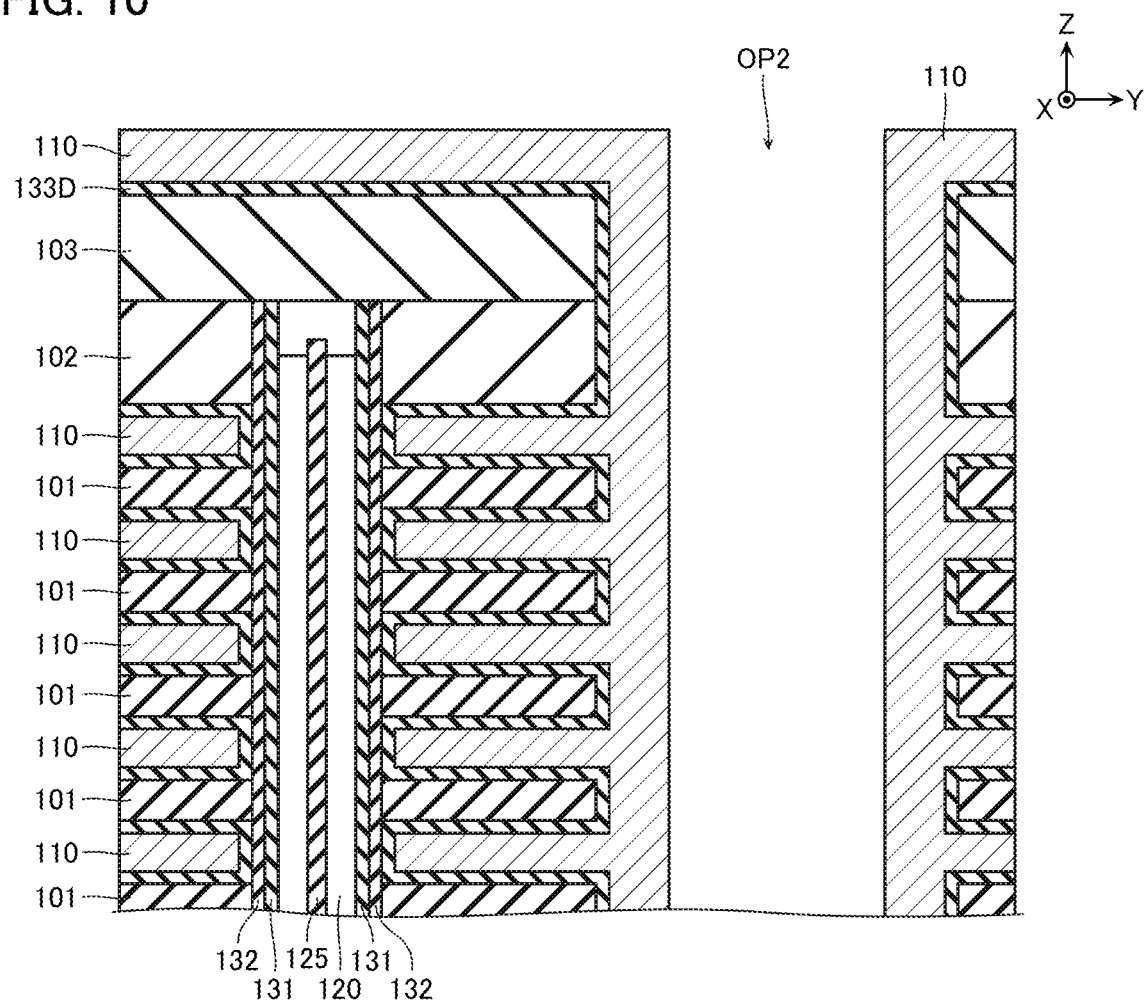
FIG. 10 is a schematic Y-Z cross-sectional view illustrating the first manufacturing method of the semiconductor memory device according to the first embodiment.

Next, as illustrated in FIG. 10, metal oxide films 133D are formed on the upper surfaces, the lower surfaces, and the side surfaces of the insulating layers 101, the upper surfaces of the insulating layers 103, the side surfaces of the insulating layers 102, 103, the lower surfaces of the insulating layers 102, and the outer peripheral surfaces of the electric charge accumulating films 132 via the opening OP2. A part of the metal oxide film 133D covering the outer peripheral surface of the electric charge accumulating film 132 becomes the block insulating film 133 (FIG. 3, FIG. 4). Additionally, a part of the metal oxide film 133D covering the upper surface and the lower surface of the insulating layer 101 becomes the insulating films 133B (FIG. 3, FIG. 4). A part of this metal oxide film 133D covering the side surfaces of the insulating layers 102, 103 becomes the etching stopper 133A (FIG. 2, FIG. 4). The metal oxide film 133D is formed by forming an aluminum oxide ($Al_2O_3$) film by CVD or the like.

Next, the conductive layers 110 are formed on the upper surfaces, the lower surfaces, and the side surfaces of the insulating layers 101, the upper surfaces of the insulating layers 103, the side surfaces of the insulating layers 102, 103, the lower surfaces of the insulating layers 102, and the outer peripheral surfaces of the electric charge accumulating films 132 where the metal oxide films 133D are formed via the opening OP2. The conductive layer 110 is formed by forming a molybdenum (Mo) film or the like by CVD or the like.

Note that when the conductive layer 110 of molybdenum (Mo) or the like is formed on the metal oxide film 133D, the molybdenum (Mo) film or the like is formed also in a crystal grain boundary between crystal grains of aluminum oxide ($Al_2O_3$), which constitutes the metal oxide film 133D.

Figure 11:
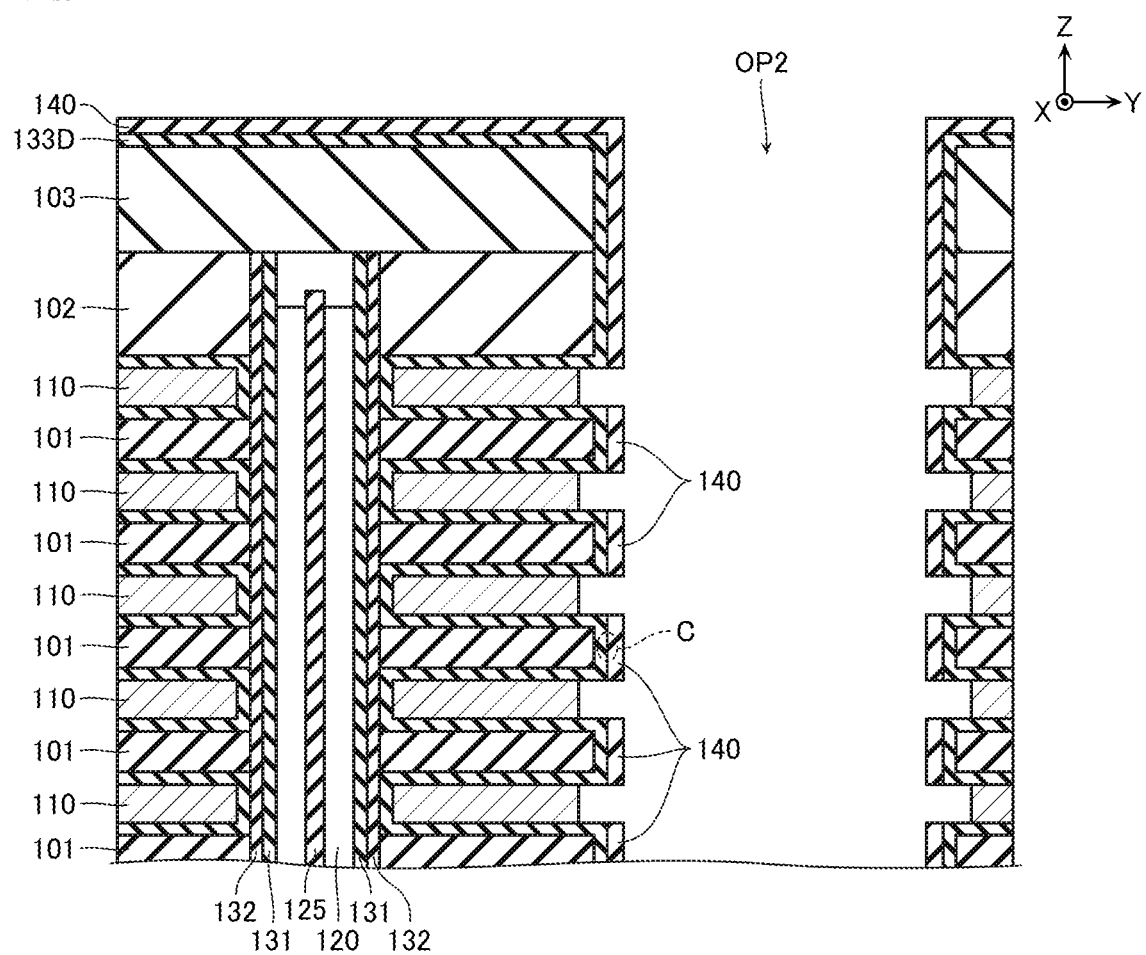
FIG. 11 is a schematic Y-Z cross-sectional view illustrating the first manufacturing method of the semiconductor memory device according to the first embodiment.

Next, as illustrated in FIG. 11, unnecessary parts of the conductive layers 110 are removed. Specifically, the conductive layers 110 formed on the upper surfaces of the insulating layers 103, the side surfaces of the insulating layers 102, 103, the side surfaces of the insulating layers 101, and the like are removed by dry etching or the like using a fluorine (F)-based gas, for example, nitrogen trifluoride ($NF_3$).

Thus, when the conductive layers 110 are removed by dry etching or the like using the fluorine (F)-based gas, aluminum fluoride ($AlF_3$) is generated. Then, aluminum fluoride layers 140 made of aluminum fluoride ($AlF_3$) are formed on the metal oxide films 133D formed on the upper surfaces of the insulating layers 103, the side surfaces of the insulating layers 102, 103, and the side surfaces of the insulating layers 101.

At this time, the molybdenum (Mo) film formed in the crystal grain boundary of aluminum oxide ($Al_2O_3$) is sandwiched between the crystal grains in the metal oxide film 133D and the aluminum fluoride layer 140 and remains in a part of the metal oxide film 133D of aluminum oxide ($Al_2O_3$) or the like covered with the aluminum fluoride layer 140, for example, the part indicated by C in FIG. 11.

Figure 12:
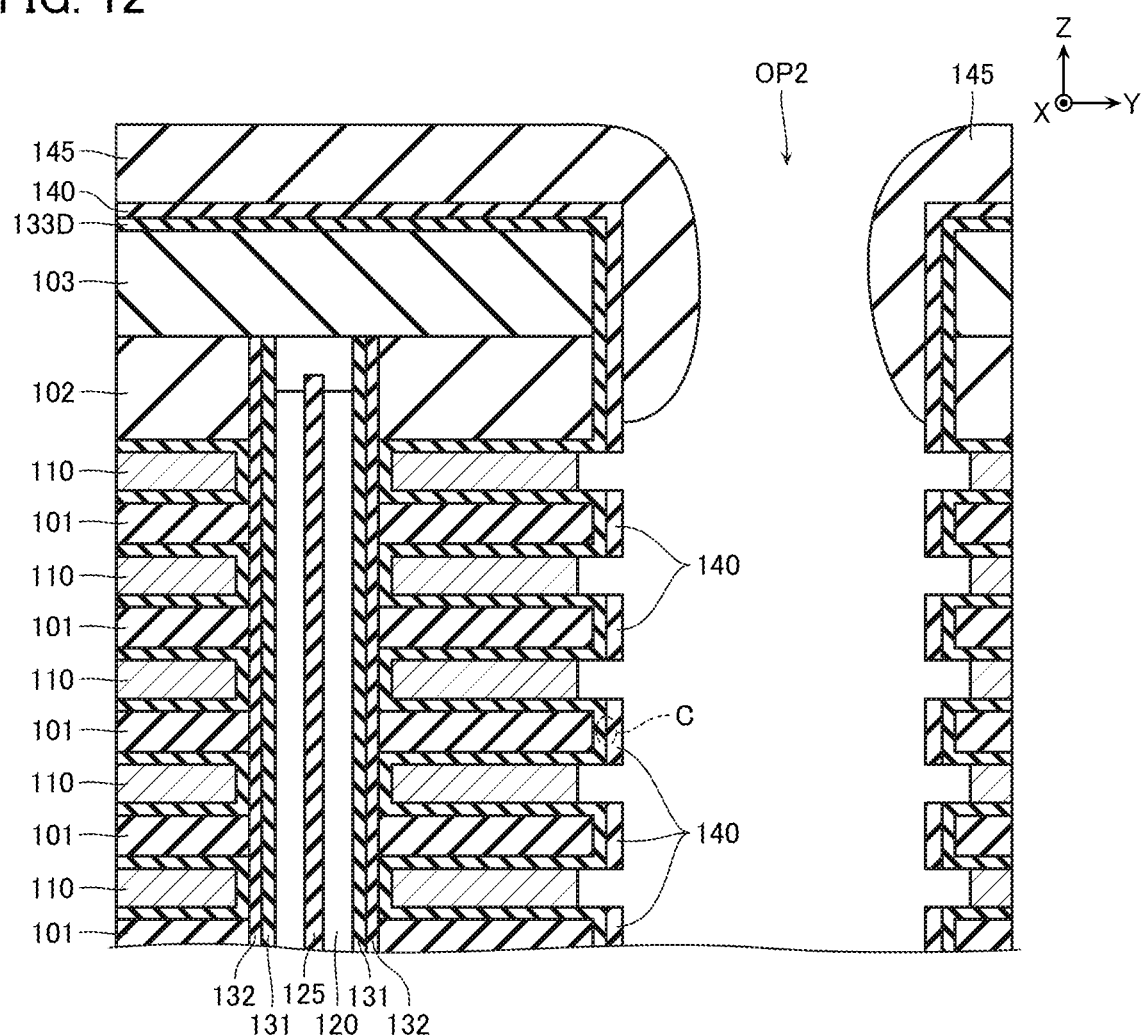
FIG. 12 is a schematic Y-Z cross-sectional view illustrating the first manufacturing method of the semiconductor memory device according to the first embodiment.

Next, as illustrated in FIG. 12, cover layers 145 are formed. The cover layer 145 covers the metal oxide film 133D and the aluminum fluoride layer 140 formed on the upper surface of the insulating layer 103 and the side surfaces of the insulating layers 102, 103. On the other hand, the cover layer 145 does not cover the metal oxide film 133D or the aluminum fluoride layer 140 formed on the upper surface, the lower surface, and the side surface of the insulating layer 101 or the like. This cover layer 145 is formed by, for example, forming a silicon oxide ($SiO_2$) film by plasma CVD using silane ($SiH_4$) as a raw material. Since this film forming method is poor in coverage, the cover layer 145 that selectively covers the metal oxide film 133D and the aluminum fluoride layer 140 formed on the upper surface of the insulating layer 103 and the side surfaces of the insulating layers 102, 103 can be formed without covering the configuration in the opening OP2.

Figure 13:
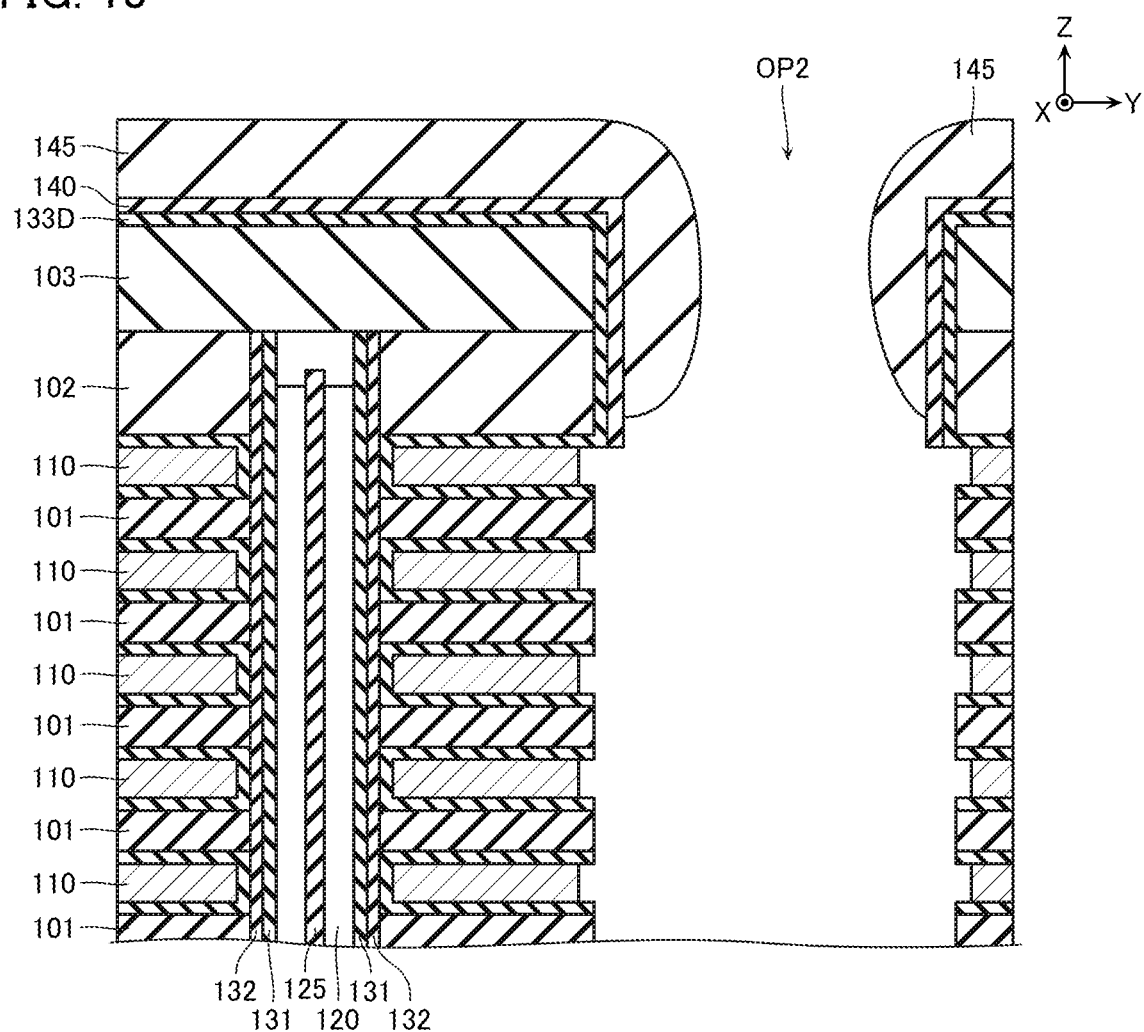
FIG. 13 is a schematic Y-Z cross-sectional view illustrating the first manufacturing method of the semiconductor memory device according to the first embodiment.

Next, as illustrated in FIG. 13, the metal oxide films 133D and the aluminum fluoride layers 140 formed on the side surfaces of the insulating layers 101 are removed by dry etching or the like using a chlorine ($Cl_2$)-based gas. Accordingly, the molybdenum (Mo) that is sandwiched between the crystal grains in the metal oxide film 133D and the aluminum fluoride layer 140 and remains in the part indicated by C in FIG. 11 or the like is also removed.

Figure 14:
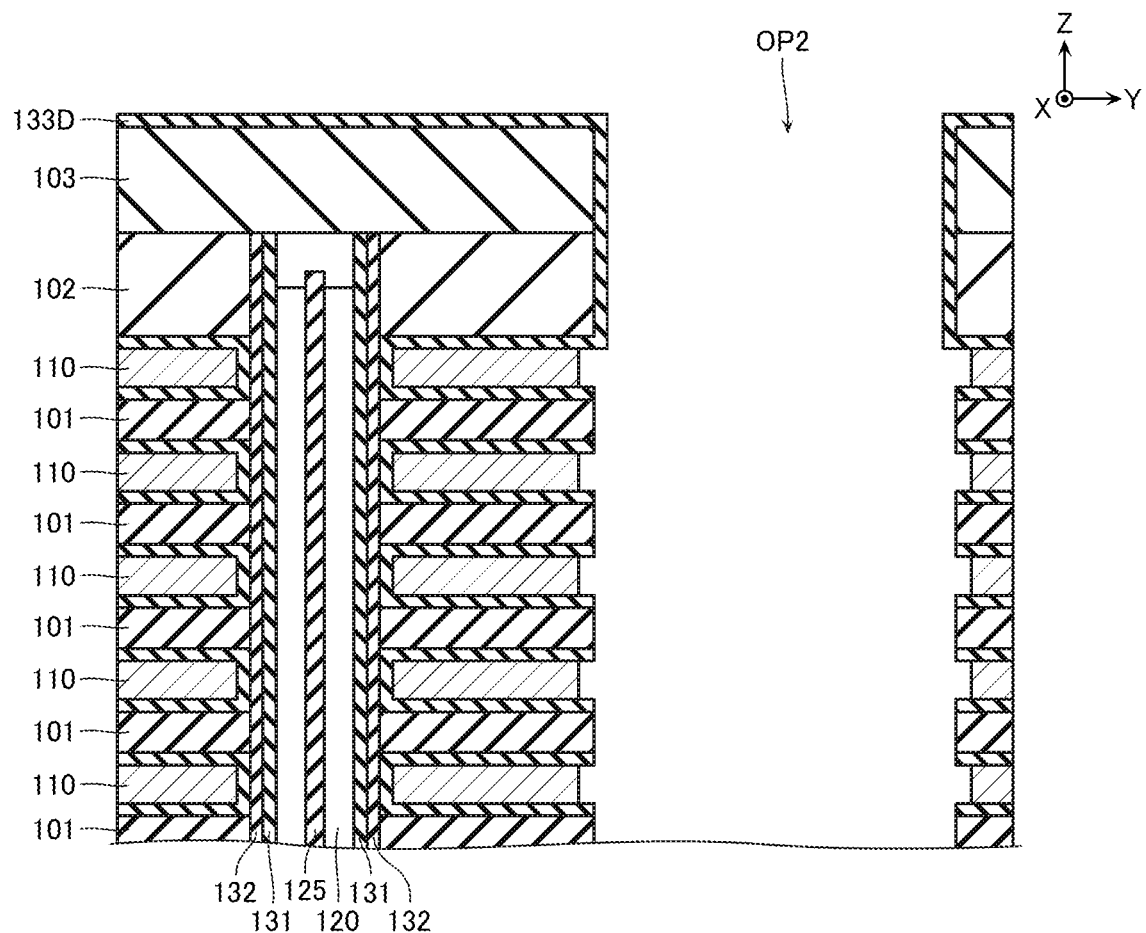
FIG. 14 is a schematic Y-Z cross-sectional view illustrating the first manufacturing method of the semiconductor memory device according to the first embodiment.

Next, as illustrated in FIG. 14, the cover layers 145 of silicon oxide ($SiO_2$) and the aluminum fluoride layers 140 covered with the cover layers 145 are removed with hydrofluoric acid produced by diluting hydrogen fluoride HF by a factor of around 1000 with a water solution.

The cover layers 145 and the aluminum fluoride layers 140 covered with the cover layers 145 may be removed by etchback.

Figure 15:
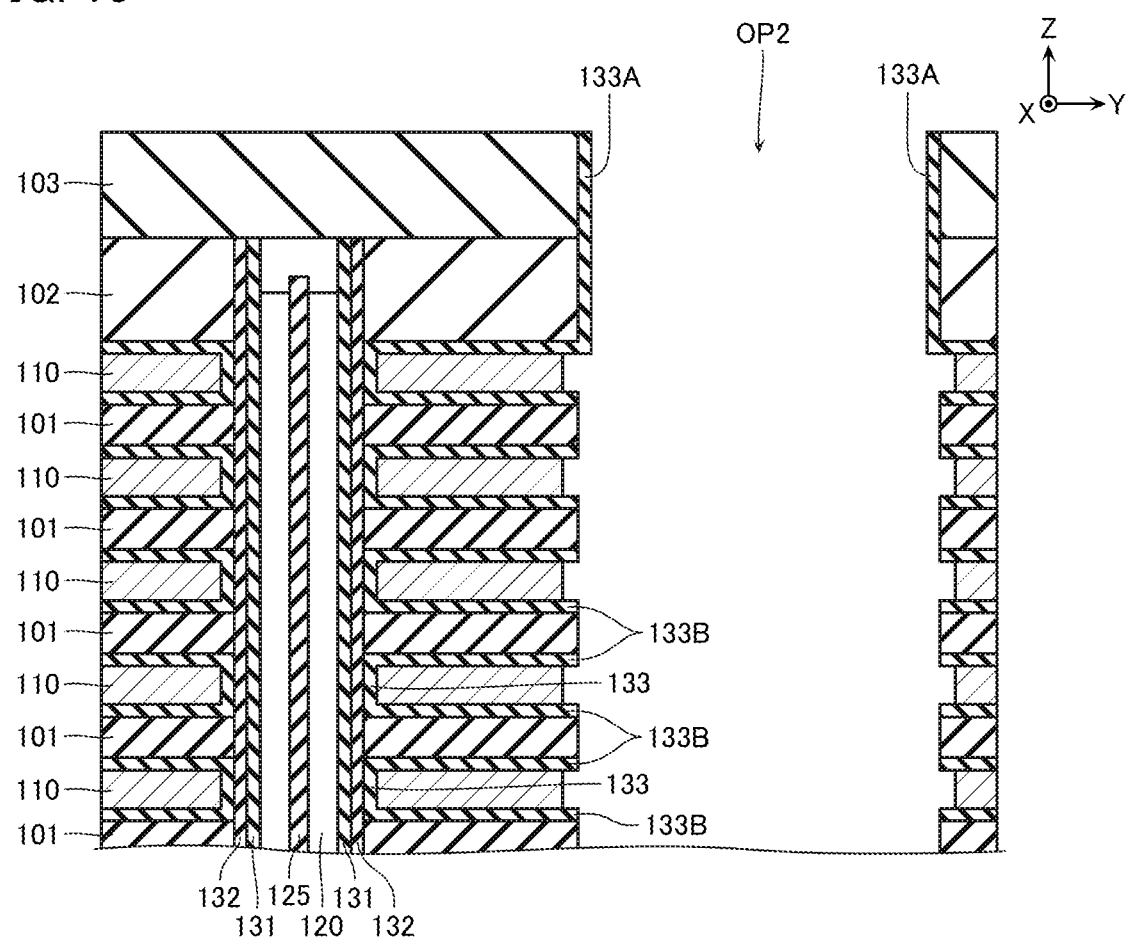
FIG. 15 is a schematic Y-Z cross-sectional view illustrating the first manufacturing method of the semiconductor memory device according to the first embodiment.

Next, as illustrated in FIG. 15, the metal oxide films 133D formed on the upper surfaces of the insulating layers 103 are removed by anisotropic etching, such as RIE, or the like. Note that the etching stoppers 133A film-formed on the side surfaces of the insulating layers 102, 103 are not removed in this process. The etching stopper 133A is disposed on the side surfaces of the insulating layers 102, 103, that is, the upper side part of the inner surface of the opening OP2.

Figure 16:
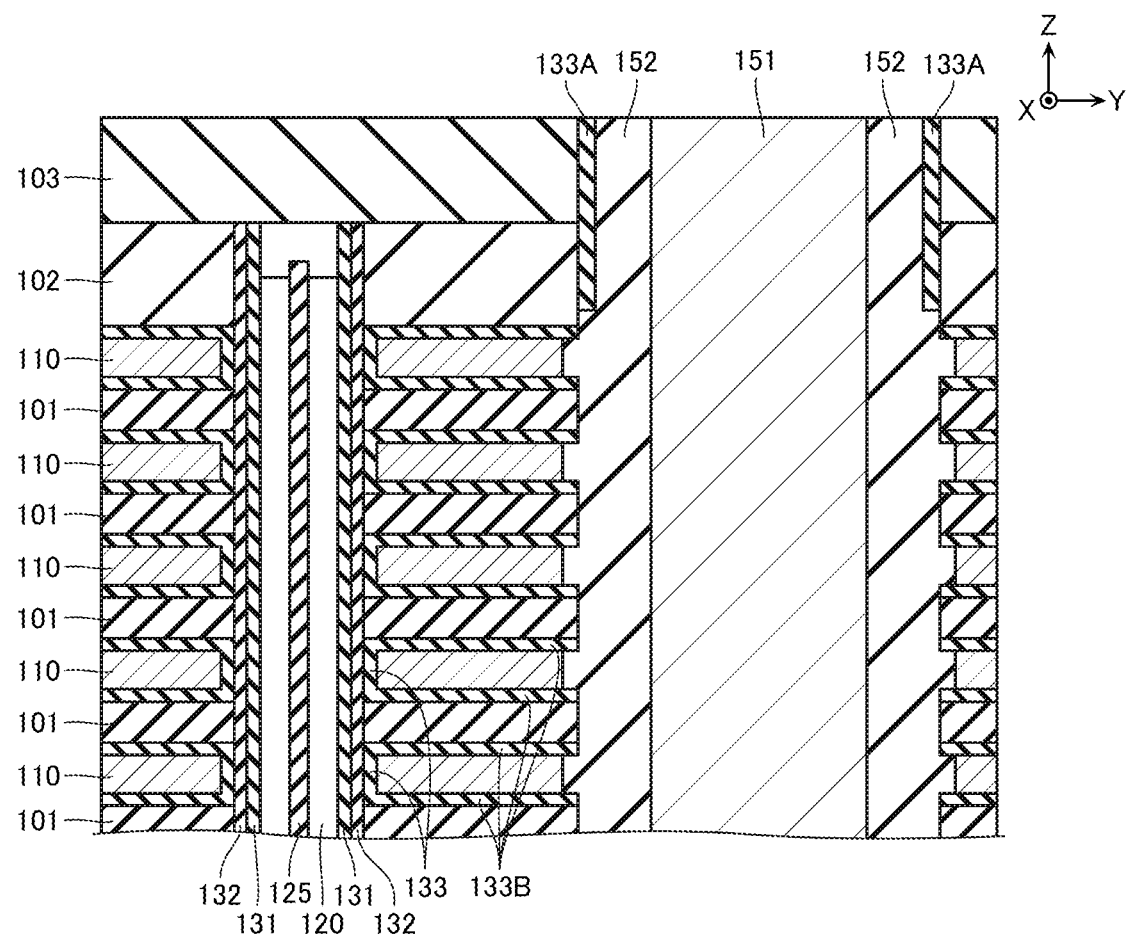
FIG. 16 is a schematic Y-Z cross-sectional view illustrating the first manufacturing method of the semiconductor memory device according to the first embodiment.

Next, as illustrated in FIG. 16, an insulating layer 152 is formed. This insulating layer 152 is formed by forming a silicon oxide ($SiO_2$) film or the like on the inner surface of the opening OP2 (the side surfaces of the conductive layers 110, the insulating layers 101, and the etching stoppers 133A) and the bottom surface of the opening OP2 (the upper surface of the semiconductor substrate 100) by means such as CVD.

Next, a part of the insulating layer 152 that covers the bottom surface of the opening OP2 is removed. This process is performed by anisotropic etching, such as RIE.

Thus, when the part of the insulating layer 152 that covers the bottom surface of the opening OP2 is removed by anisotropic etching, such as RIE, the etching stoppers 133A where the etching rate is low (the etching resistance is high) serve as masks. Consequently, lateral (Y-direction) etching does not proceed in the upper side part of the opening OP2. Accordingly, this method allows selectively removing a part of the insulating layer 152 without removing the insulating layers 102, 103 made of silicon oxide ($SiO_2$) or the like by etching, such as RIE.

Next, the conductive layer 151 is formed between the insulating layers 152. The conductive layer 151 is formed by forming a tungsten (W) film or the like by means such as CVD.

After that, the insulating layers 104 and the contacts 120C as illustrated in FIG. 2 are formed to manufacture the semiconductor memory device as illustrated in FIG. 1 to FIG. 4.

[Second Manufacturing Method of Semiconductor Memory Device According to First Embodiment]

Next, with reference to FIG. 17 to FIG. 28, a part of the second manufacturing method of the semiconductor memory device according to the first embodiment will be described. Here, the distinctive part of the second manufacturing method will be described. FIG. 17 to FIG. 28 omit illustrations of configuration members of the semiconductor column 120 and around the semiconductor column 120 and configuration members on the right side of the opening OP2.

Figure 17:
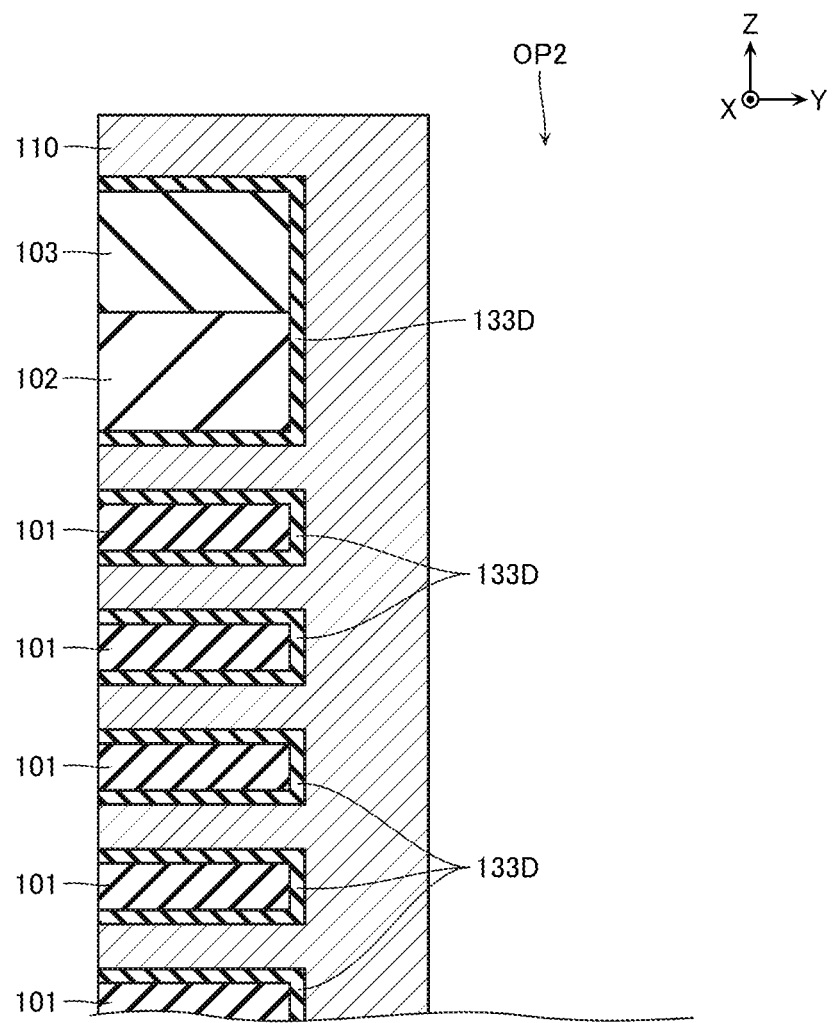
FIG. 17 is a schematic Y-Z cross-sectional view illustrating a second manufacturing method of the semiconductor memory device according to the first embodiment.

First, similarly to the first manufacturing method, the processes that have been described with reference to FIG. 5 to FIG. 10 are performed. Then, as illustrated in FIG. 17, the metal oxide film 133D made of aluminum oxide ($Al_2O_3$) is formed on the upper surfaces, the lower surfaces, and the side surfaces of the insulating layers 101, the upper surface of the insulating layer 103, the side surfaces of the insulating layers 102, 103, the lower surface of the insulating layer 102, and the outer peripheral surface of the electric charge accumulating film 132 (not illustrated in FIG. 17), and further the conductive layer 110 made of molybdenum (Mo) or the like is formed on the metal oxide film 133D.

At this time, as described above, the molybdenum (Mo) film is formed also on the crystal grain boundaries between the crystal grains of aluminum oxide ($Al_2O_3$) constituting the metal oxide film 133D.

Figure 18:
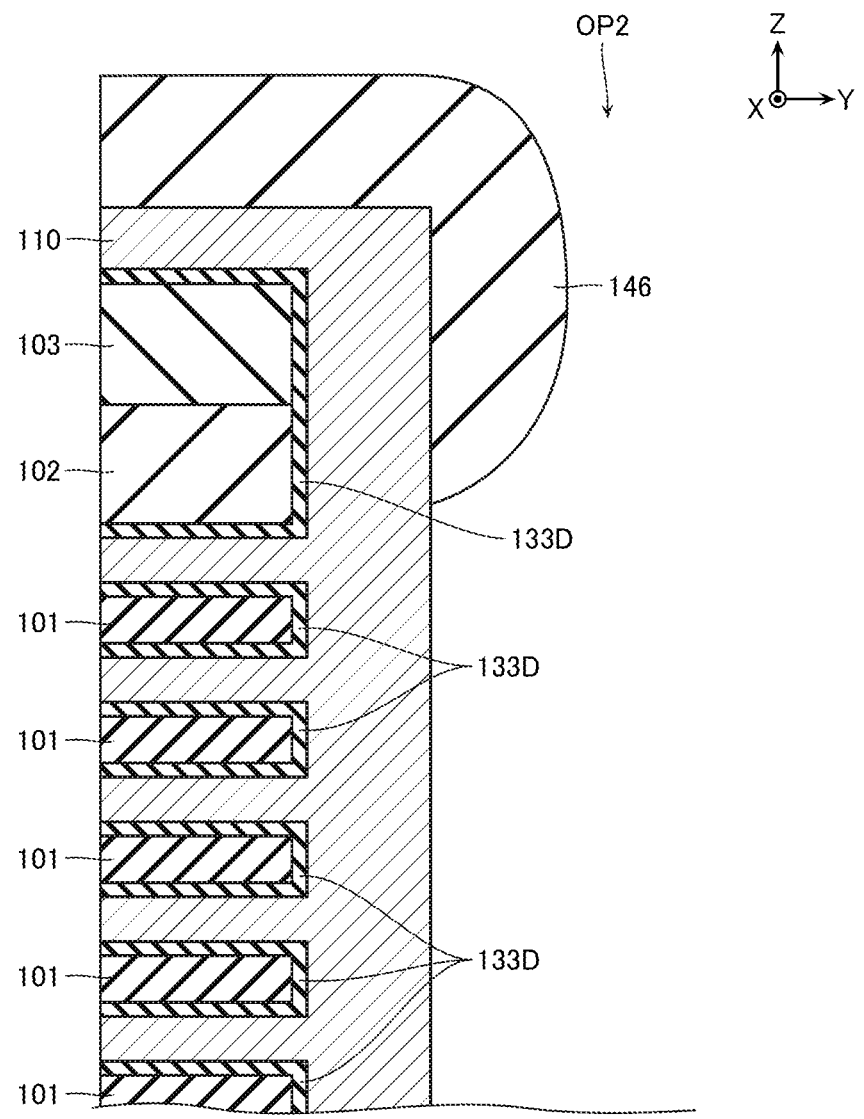
FIG. 18 is a schematic Y-Z cross-sectional view illustrating the second manufacturing method of the semiconductor memory device according to the first embodiment.

Next, as illustrated in FIG. 18, a cover layer 146 is formed. The cover layer 146 covers the metal oxide film 133D and the conductive layer 110 formed on the upper surface of the insulating layer 103 and the side surfaces of the insulating layers 102, 103. On the other hand, the cover layer 146 does not cover the metal oxide film 133D or the conductive layer 110 formed on the side surface of the insulating layer 101 and the like. This cover layer 146 is formed by forming a silicon oxide ($SiO_2$) film by, for example, plasma CVD using silane ($SiH_4$) as a raw material.

Figure 19:
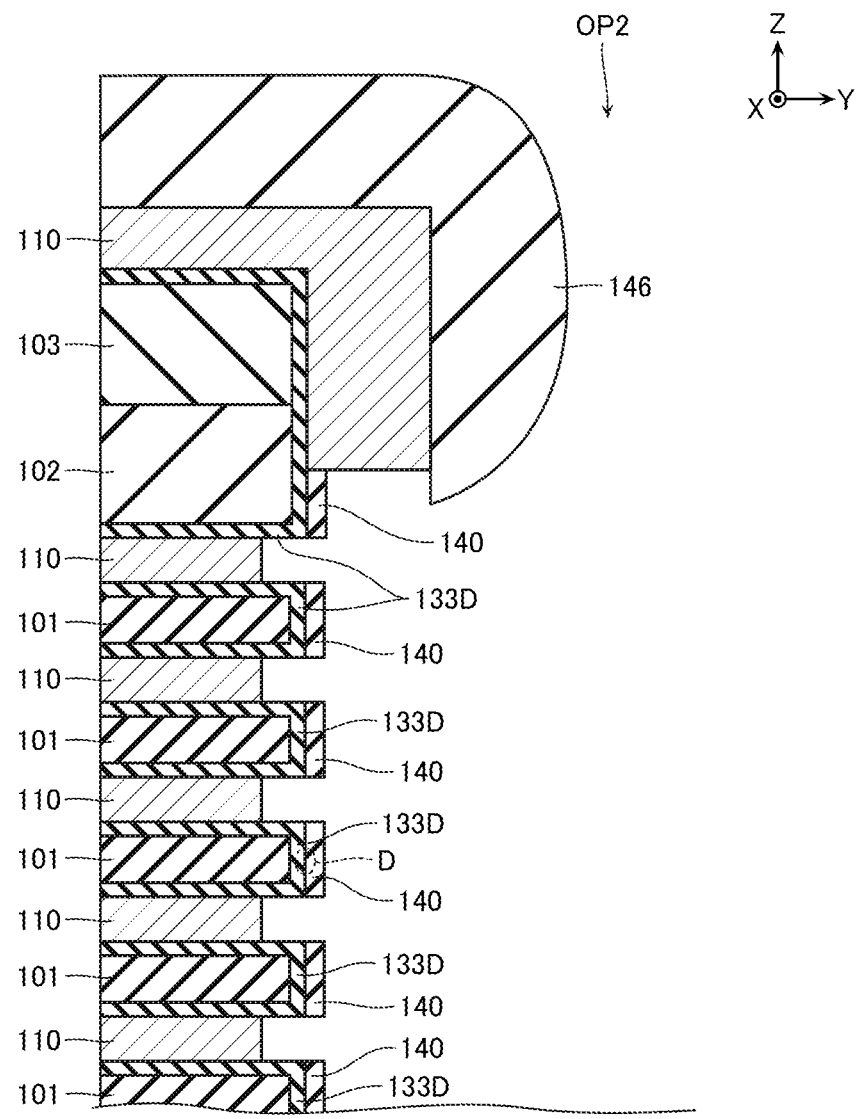
FIG. 19 is a schematic Y-Z cross-sectional view illustrating the second manufacturing method of the semiconductor memory device according to the first embodiment.

Next, as illustrated in FIG. 19, an unnecessary part of the conductive layer 110 is removed. Specifically, the conductive layer 110 formed on the lower side part of the side surface of the insulating layer 102, the side surfaces of the insulating layers 101, and the like are removed by dry etching or the like using a fluorine (F)-based gas, for example, nitrogen trifluoride ($NF_3$).

Thus, when the conductive layer 110 is removed by dry etching or the like using the fluorine (F)-based gas, aluminum fluoride ($AlF_3$) is generated. Then, on the metal oxide film 133D formed on the lower side part of the side surface of the insulating layer 102 and the side surfaces of the insulating layers 101, the aluminum fluoride layers 140 made of aluminum fluoride ($AlF_3$) are formed.

At this time, in a part of the metal oxide film 133D of aluminum oxide ($Al_2O_3$) or the like covered with the aluminum fluoride layer 140, for example, the part indicated by D in FIG. 19, the molybdenum (Mo) film formed on the crystal grain boundary of the aluminum oxide ($Al_2O_3$) is sandwiched between the crystal grains in the metal oxide film 133D and the aluminum fluoride layer 140 and remains.

Figure 20:
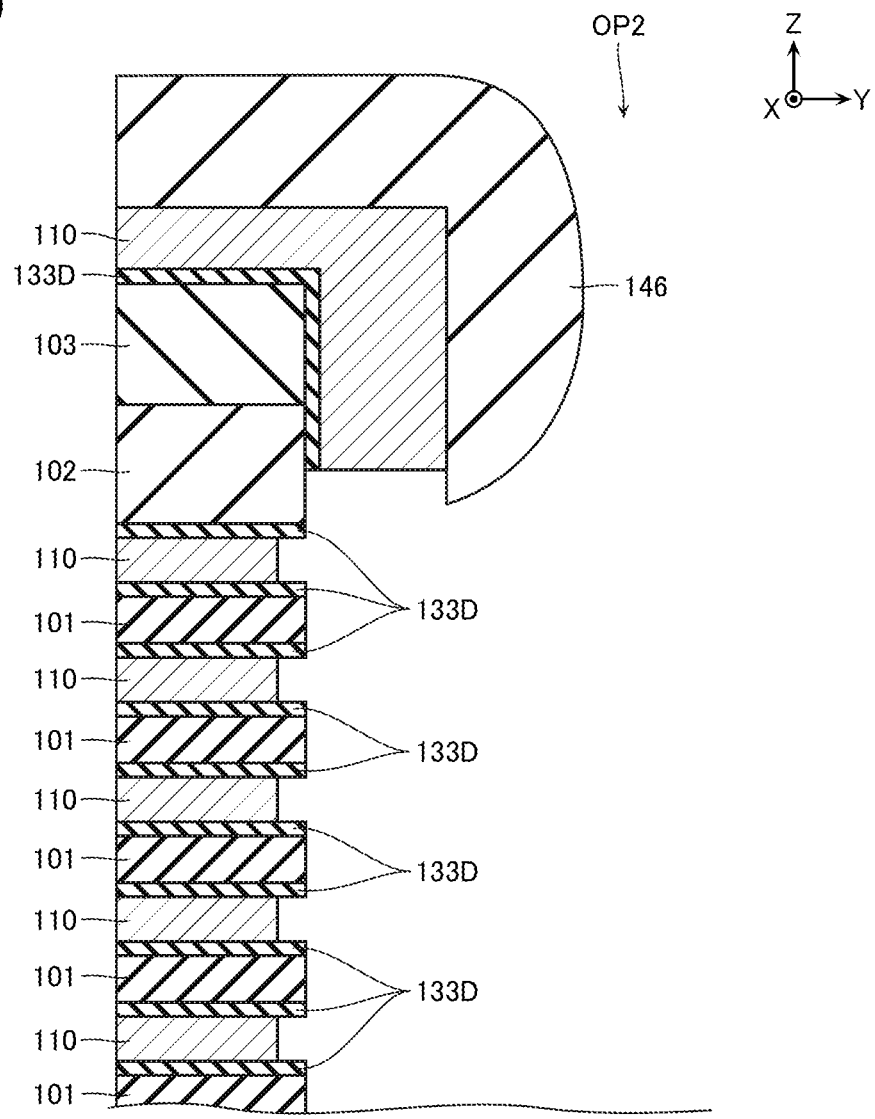
FIG. 20 is a schematic Y-Z cross-sectional view illustrating the second manufacturing method of the semiconductor memory device according to the first embodiment.

Next, as illustrated in FIG. 20, the metal oxide film 133D and the aluminum fluoride layers 140 formed on the lower side part of the side surface of the insulating layer 102 and the side surfaces of the insulating layers 101 are removed by dry etching or the like using a chlorine ($Cl_2$)-based gas. Thus, the molybdenum (Mo) sandwiched between the crystal grains in the metal oxide film 133D and the aluminum fluoride layer 140 and remains in the part indicated by D in FIG. 19 or the like is also removed.

Figure 21:
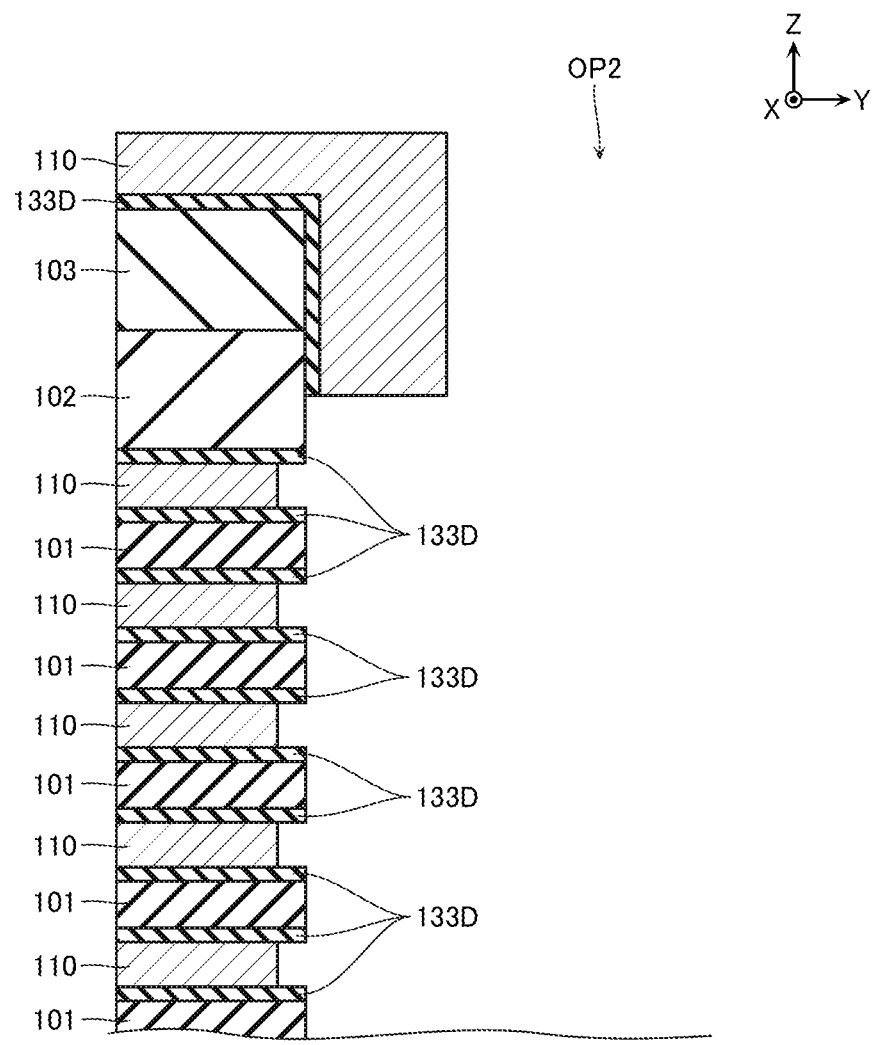
FIG. 21 is a schematic Y-Z cross-sectional view illustrating the second manufacturing method of the semiconductor memory device according to the first embodiment.

Next, as illustrated in FIG. 21, the cover layer 146 of silicon oxide ($SiO_2$) is removed with hydrofluoric acid produced by diluting the hydrogen fluoride HF by a factor of around 1000 with a water solution.

Figure 22:
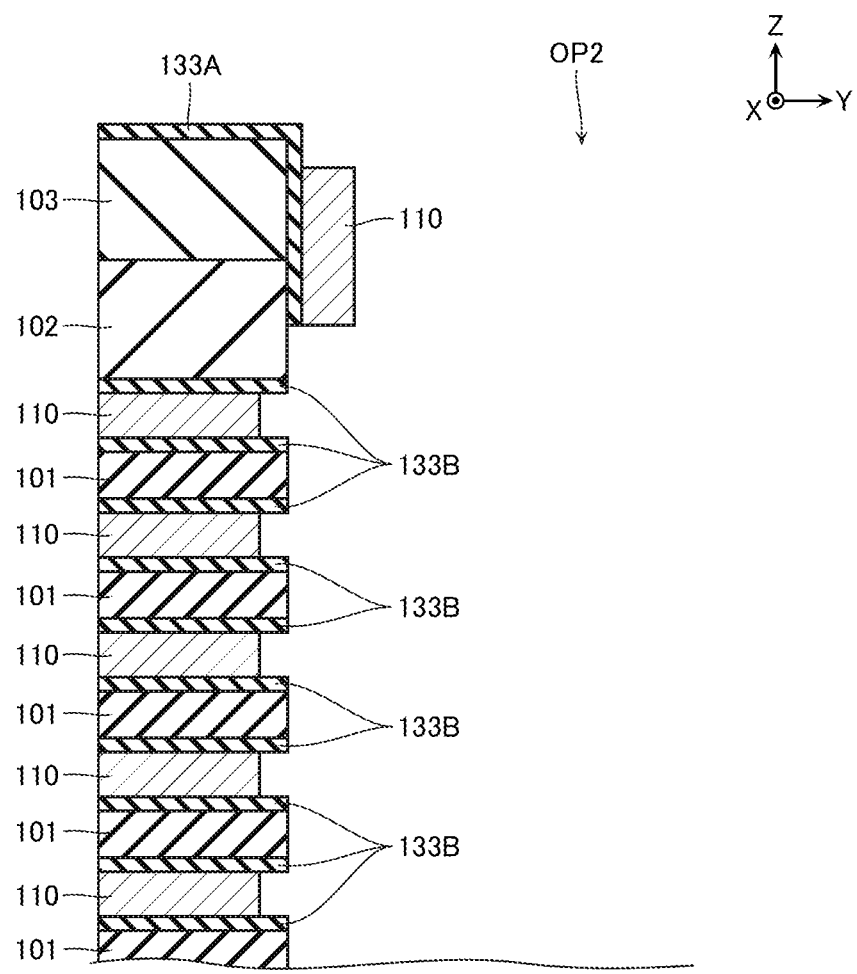
FIG. 22 is a schematic Y-Z cross-sectional view illustrating the second manufacturing method of the semiconductor memory device according to the first embodiment.

Next, as illustrated in FIG. 22, a part of the conductive layer 110 formed on the upper surface and the upper side part of the side surface of the insulating layer 103 is removed by anisotropic etching or the like. Note that the etching stopper 133A film-formed on the upper surface and the side surface of the insulating layer 103 and the upper side part of the side surface of the insulating layer 102 is not removed in this process. The etching stopper 133A is disposed on the upper side part of the inner surface of the opening OP2.

Figure 23:
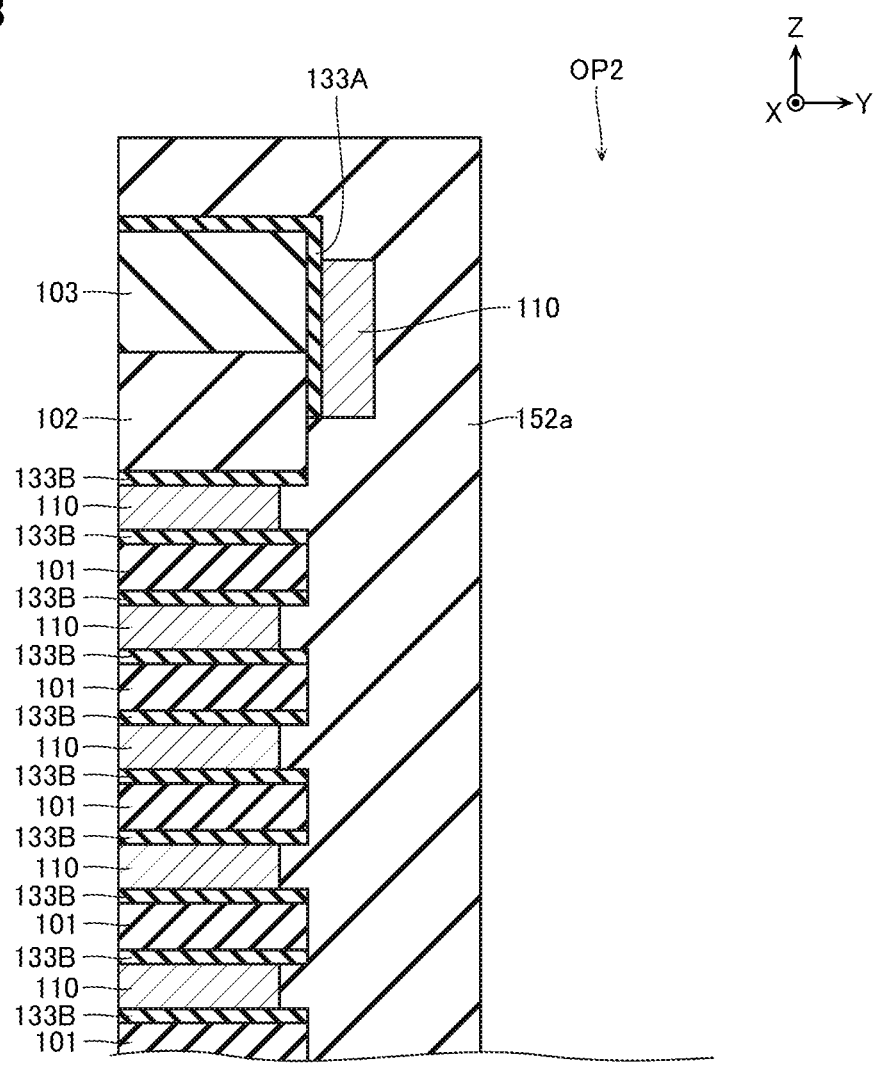
FIG. 23 is a schematic Y-Z cross-sectional view illustrating the second manufacturing method of the semiconductor memory device according to the first embodiment.

Next, as illustrated in FIG. 23, an insulating layer 152a is formed. This insulating layer 152a is formed by forming a silicon oxide ($SiO_2$) film or the like on the upper surface of the etching stopper 133A, the inner surface of the opening OP2 (the side surfaces of the conductive layers 110, the insulating layers 101, and the etching stopper 133A), and the bottom surface of the opening OP2 (the upper surface of the semiconductor substrate 100) by means such as CVD.

Figure 24:
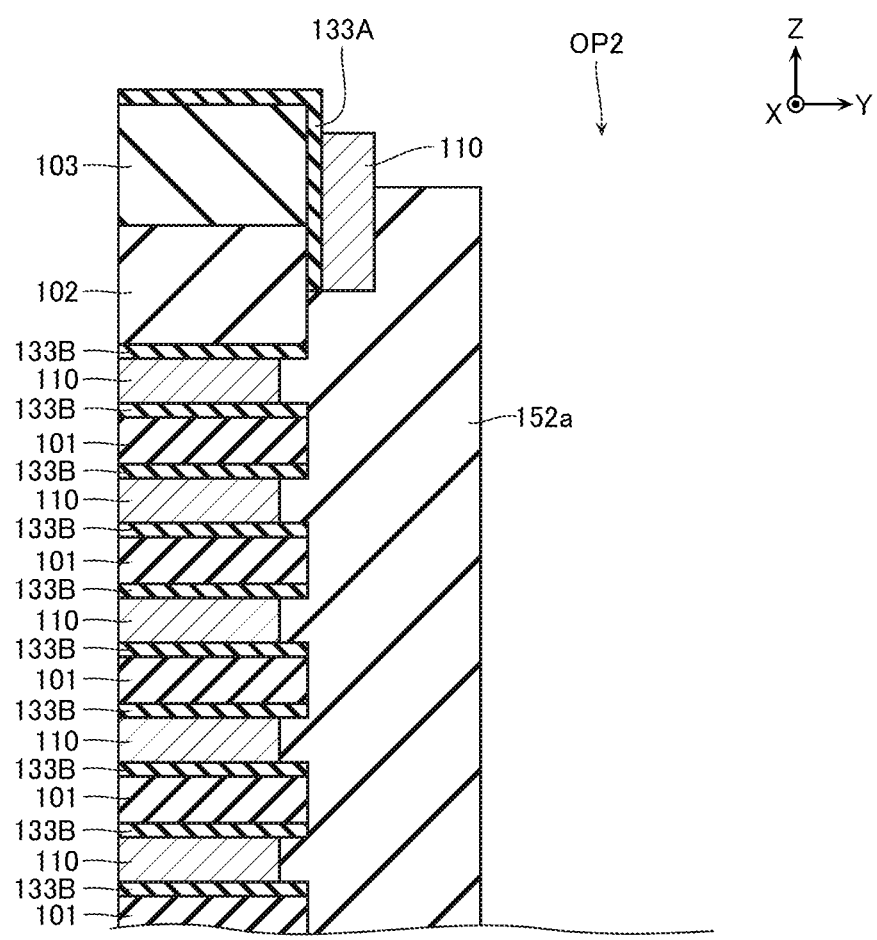
FIG. 24 is a schematic Y-Z cross-sectional view illustrating the second manufacturing method of the semiconductor memory device according to the first embodiment.

Next, as illustrated in FIG. 24, by method such as RIE, the upper side part of the insulating layer 152a of silicon oxide ($SiO_2$) is removed. In this process, the insulating layer 152a is removed until the conductive layer 110 in contact with the etching stopper 133A exposes.

Figure 25:
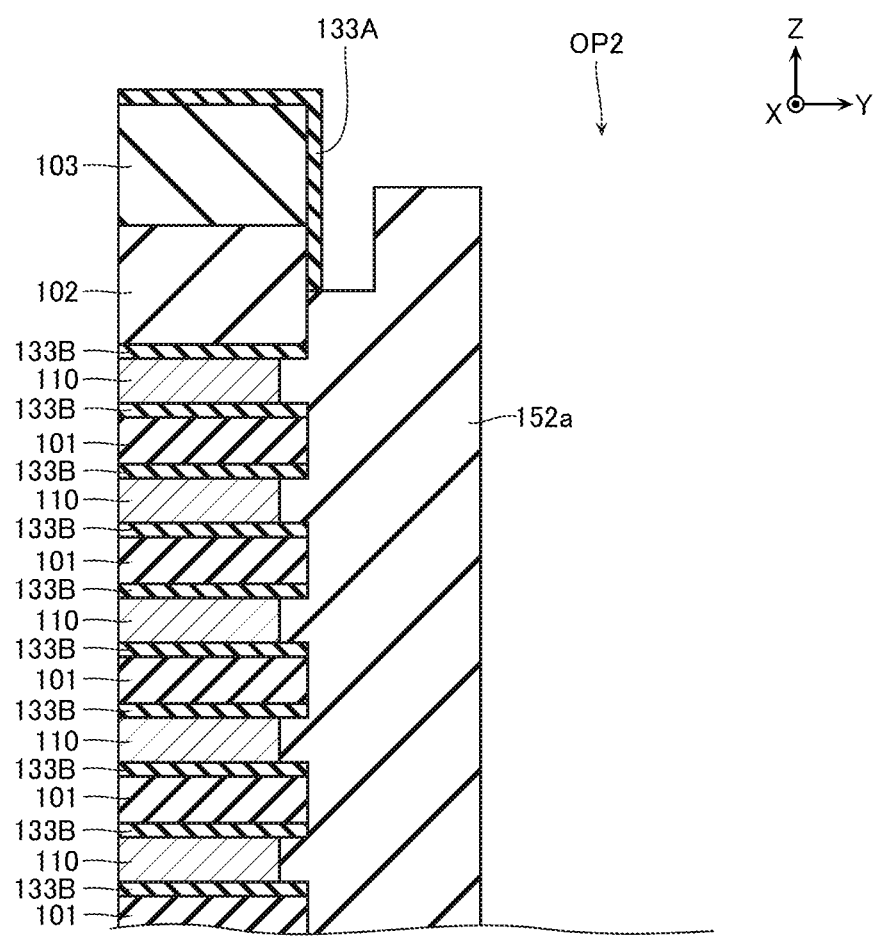
FIG. 25 is a schematic Y-Z cross-sectional view illustrating the second manufacturing method of the semiconductor memory device according to the first embodiment.

Next, as illustrated in FIG. 25, the conductive layer 110 in contact with the etching stopper 133A is etched with a hydrogen peroxide solution ($H_2O_2$).

Figure 26:
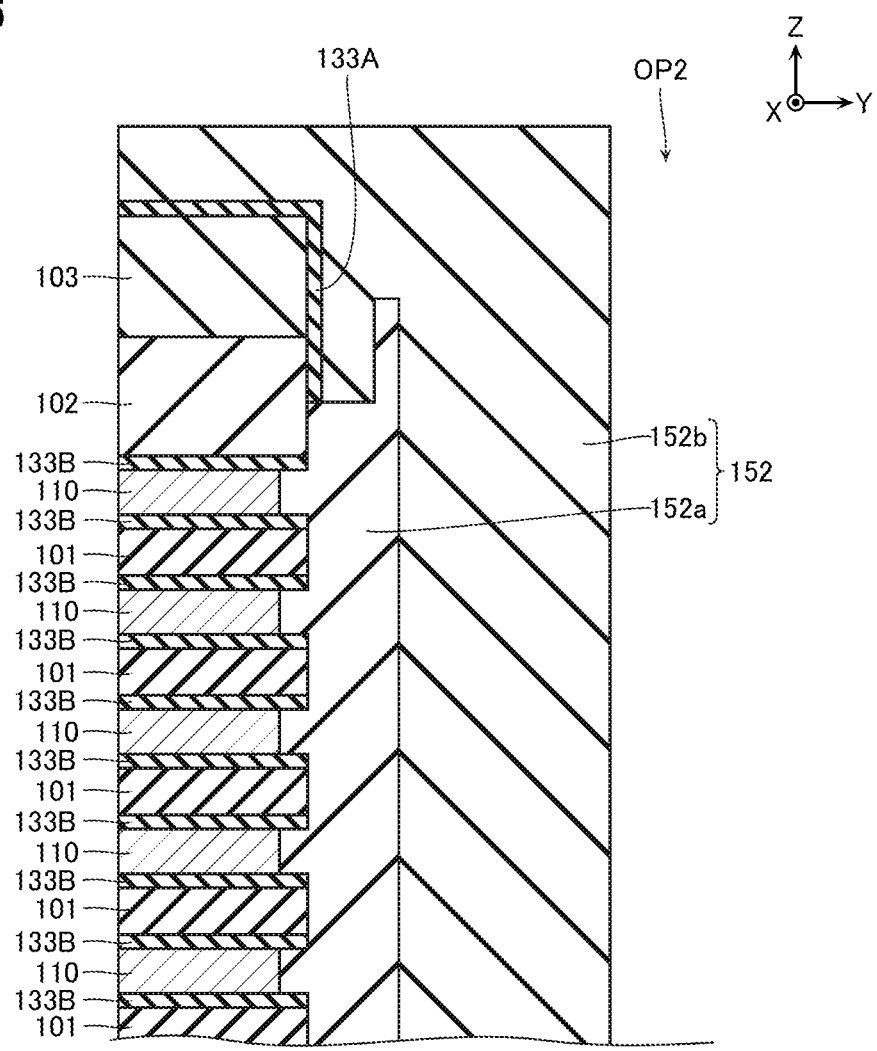
FIG. 26 is a schematic Y-Z cross-sectional view illustrating the second manufacturing method of the semiconductor memory device according to the first embodiment.

Next, as illustrated in FIG. 26, an insulating layer 152b is formed. This insulating layer 152b is formed by forming a silicon oxide ($SiO_2$) film or the like on the inner surface and the bottom surface of the insulating layer 152a and the side surface and the upper surface of the etching stopper 133A by means such as CVD. The insulating layer 152 is formed by the insulating layer 152a and the insulating layer 152b.

Next, a part of the insulating layer 152 (152a, 152b) covering the bottom surface of the opening OP2 is removed. This process is performed by anisotropic etching, such as RIE.

Thus, when the part of the insulating layer 152 (152a, 152b) that covers the bottom surface of the opening OP2 is removed by anisotropic etching, such as RIE, the etching stopper 133A where the etching rate is low (the etching resistance is high) serves as a mask. Consequently, lateral (Y-direction) etching does not proceed in the upper portion of the opening OP2. Accordingly, this method allows selectively removing a part of the insulating layer 152 without removing the insulating layers 102, 103 made of silicon oxide ($SiO_2$) or the like by etching, such as RIE.

Figure 27:
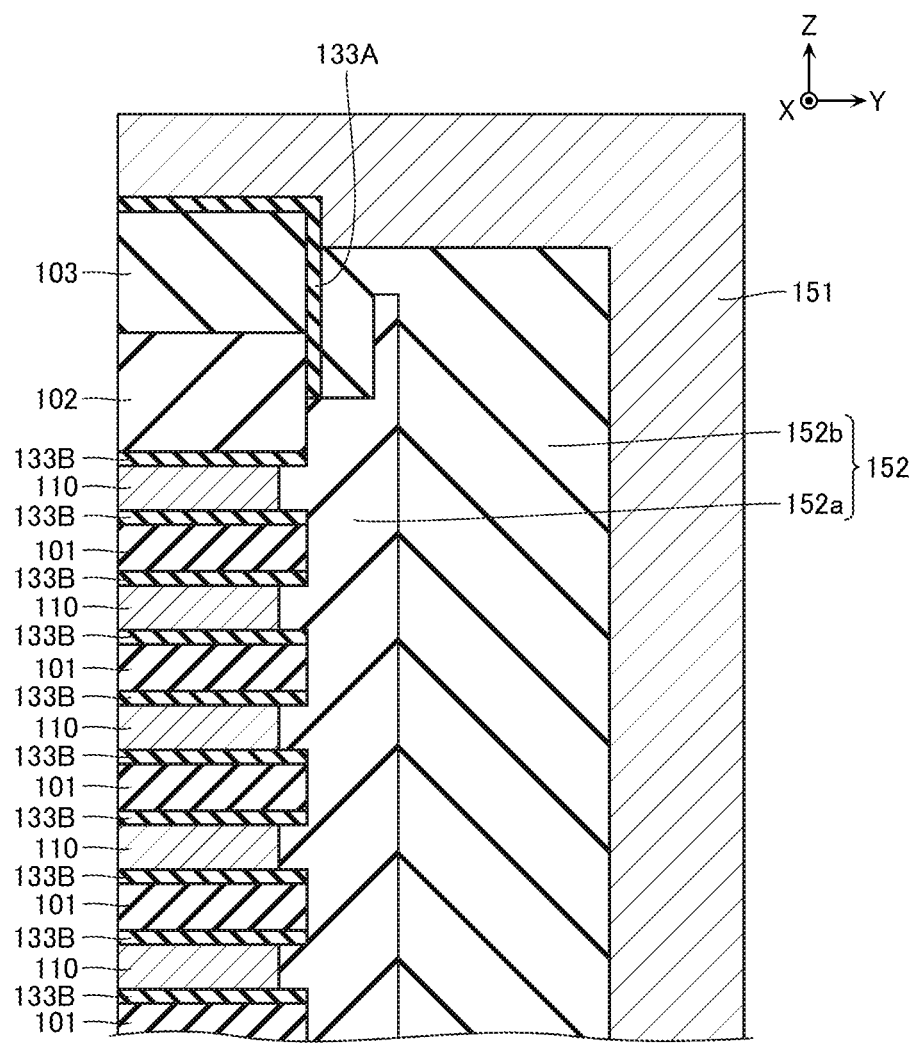
FIG. 27 is a schematic Y-Z cross-sectional view illustrating the second manufacturing method of the semiconductor memory device according to the first embodiment.

Next, as illustrated in FIG. 27, the conductive layer 151 is formed on the side surface of the insulating layer 152 (152a, 152b), the upper surface of the insulating layer 152 (152a, 152b), and the upper surface of the etching stopper 133A. The conductive layer 151 is formed by forming a tungsten (W) film or the like by means such as CVD.

Figure 28:
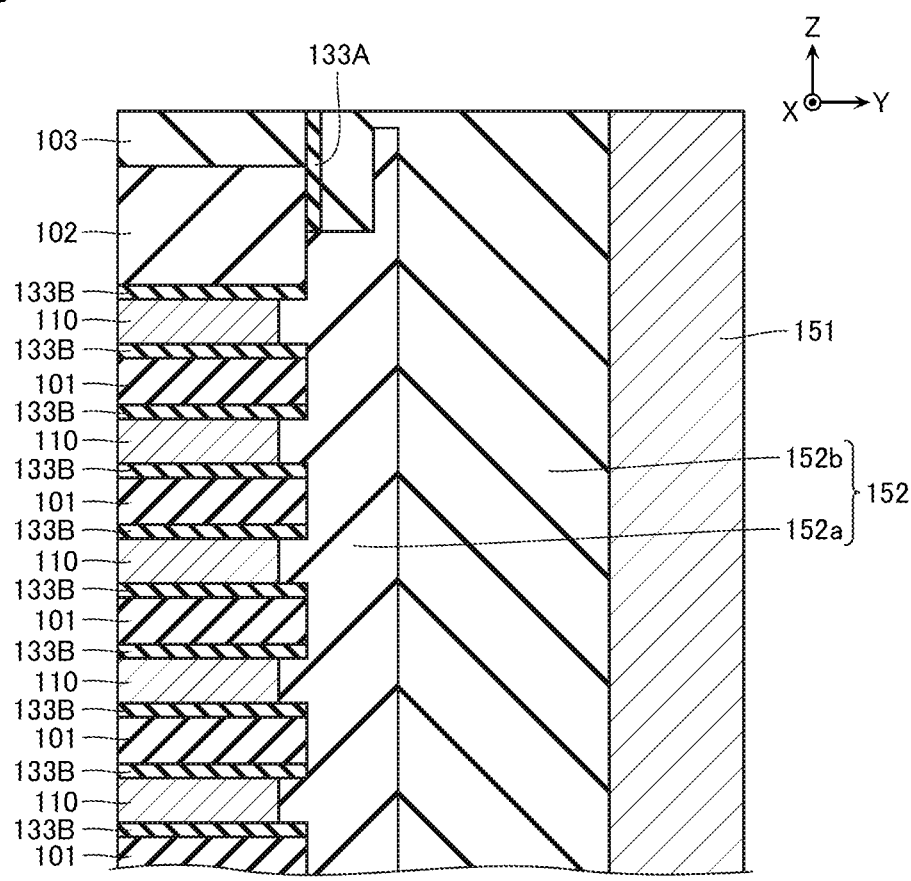
FIG. 28 is a schematic Y-Z cross-sectional view illustrating the second manufacturing method of the semiconductor memory device according to the first embodiment.

Next, as illustrated in FIG. 28, the upper side part of the conductive layer 151, the upper side part of the insulating layer 152 (152a, 152b), the upper side part of the etching stopper 133A, and the upper side part of the insulating layer 103 are removed by Chemical Mechanical Polishing (CMP) to be planarized.

After that, the insulating layers 104 and the contacts 120C as illustrated in FIG. 2 and FIG. 4 are formed, and thus the semiconductor memory device as illustrated in FIG. 1 to FIG. 4 is manufactured.

[Manufacturing Method of Comparative Example]

Next, with reference to FIG. 29 to FIG. 32, the gist of the manufacturing method of the semiconductor memory device according to the comparative example will be described.

[Manufacturing Method of First Comparative Example]

The manufacturing method of the first comparative example first performs the processes described with reference to FIG. 5 to FIG. 10, similarly to the first manufacturing method of the semiconductor memory device according to the first embodiment. When the process illustrated in FIG. 10 is completed, as described above, the metal oxide films 133D made of aluminum oxide ($Al_2O_3$) are formed on the upper surfaces, the lower surfaces, and the side surfaces of the insulating layers 101, the upper surfaces of the insulating layers 103, the side surfaces of the insulating layers 102, 103, the lower surfaces of the insulating layers 102, and the outer peripheral surfaces of the electric charge accumulating films 132. Further, the conductive layers 110 made of molybdenum (Mo) or the like are formed on the metal oxide films 133D.

At this time, as described above, the molybdenum (Mo) film is formed also in the crystal grain boundary between the crystal grains of aluminum oxide ($Al_2O_3$) constituting the metal oxide film 133D.

Figure 29:
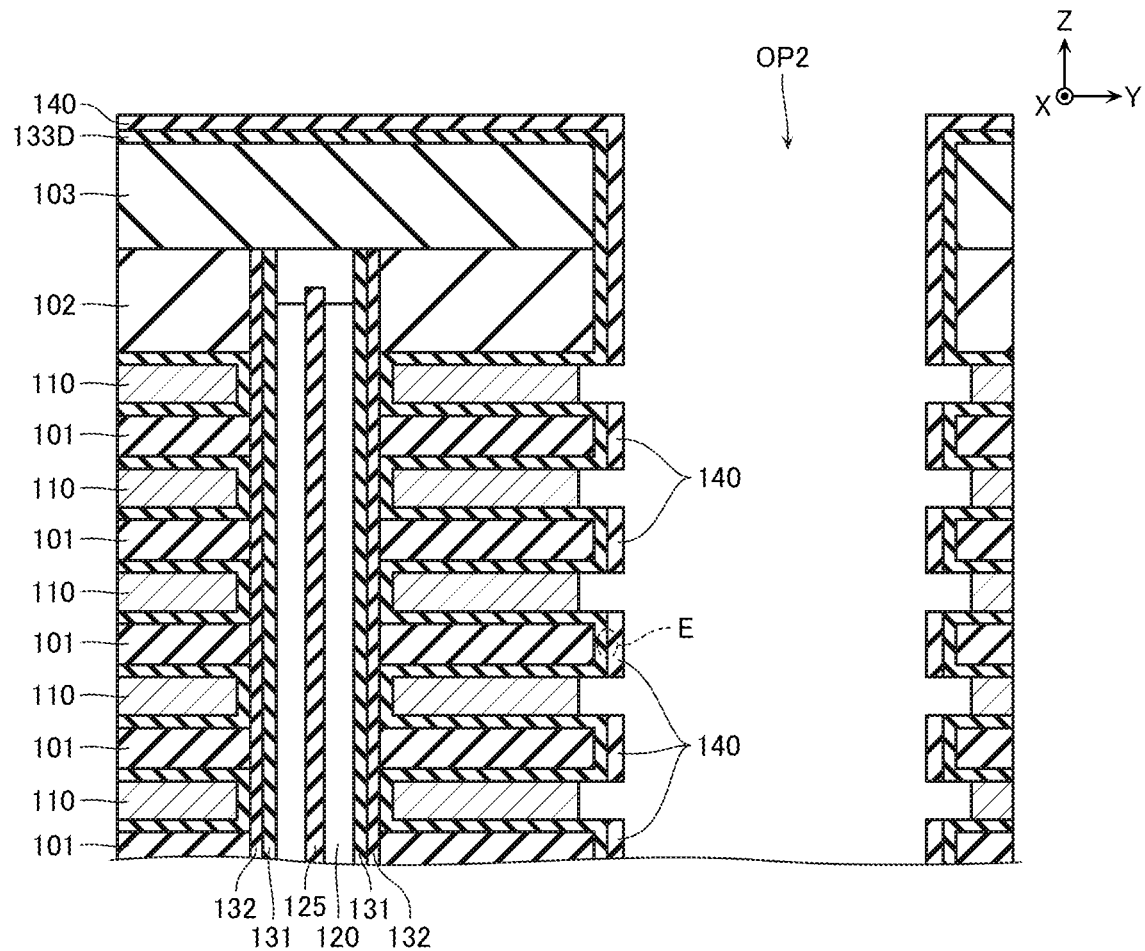
FIG. 29 is a schematic Y-Z cross-sectional view illustrating a manufacturing method of a semiconductor memory device according to a first comparative example.

Next, as illustrated in FIG. 29, in the conductive layers 110, the conductive layers 110 formed on the upper surfaces of the insulating layers 103, the side surfaces of the insulating layers 102, 103, the side surfaces of the insulating layers 101, and the like are removed by dry etching or the like using a fluorine (F)-based gas, for example, nitrogen trifluoride ($NF_3$).

Thus, when the conductive layers 110 are removed by dry etching or the like using the fluorine (F)-based gas, the aluminum fluoride layers 140 made of aluminum fluoride ($AlF_3$) are formed on the metal oxide films 133D formed on the upper surfaces of the insulating layers 103, the side surfaces of the insulating layers 102, 103, and the side surfaces of the insulating layers 101.

At this time, the molybdenum (Mo) film formed in the crystal grain boundary of aluminum oxide ($Al_2O_3$) is sandwiched between the crystal grains in the metal oxide film 133D and the aluminum fluoride layer 140 and remains in a part of the metal oxide film 133D made of aluminum oxide ($Al_2O_3$) covered with the aluminum fluoride layer 140, for example, the part indicated by E in FIG. 29.

Figure 30:
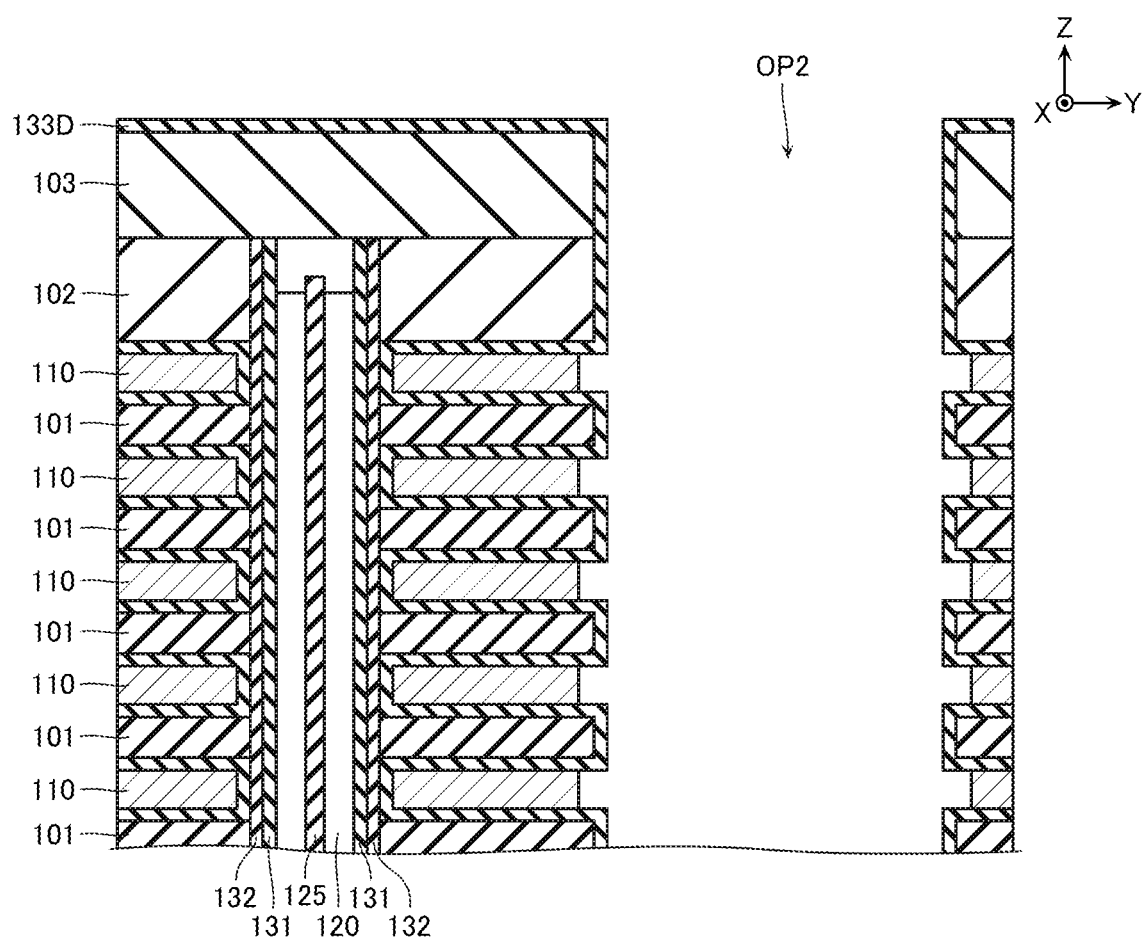
FIG. 30 is a schematic Y-Z cross-sectional view illustrating the manufacturing method of the semiconductor memory device according to the first comparative example.

Next, as illustrated in FIG. 30, the aluminum fluoride layers 140 are removed with hydrogen fluoride (HF) or the like.

In this case, the molybdenum (Mo) film formed in the crystal grain boundary of aluminum oxide ($Al_2O_3$) remains in the metal oxide film 133D made of aluminum oxide ($Al_2O_3$) formed on the side surface of the insulating layer 101.

Accordingly, the two conductive layers 110 adjacent in the Z-direction are electrically connected via the molybdenum (Mo) remaining in the crystal grain boundary in the metal oxide film 133D, possibly resulting in short.

[Manufacturing Method of Second Comparative Example]

The manufacturing method of the second comparative example first performs the processes described with reference to FIG. 5 to FIG. 10, similarly to the first manufacturing method of the semiconductor memory device according to the first embodiment.

When the process illustrated in FIG. 10 is completed, as described above, the molybdenum (Mo) film is formed also in the crystal grain boundary between the crystal grains of aluminum oxide ($Al_2O_3$) constituting the metal oxide film 133D.

Figure 31:
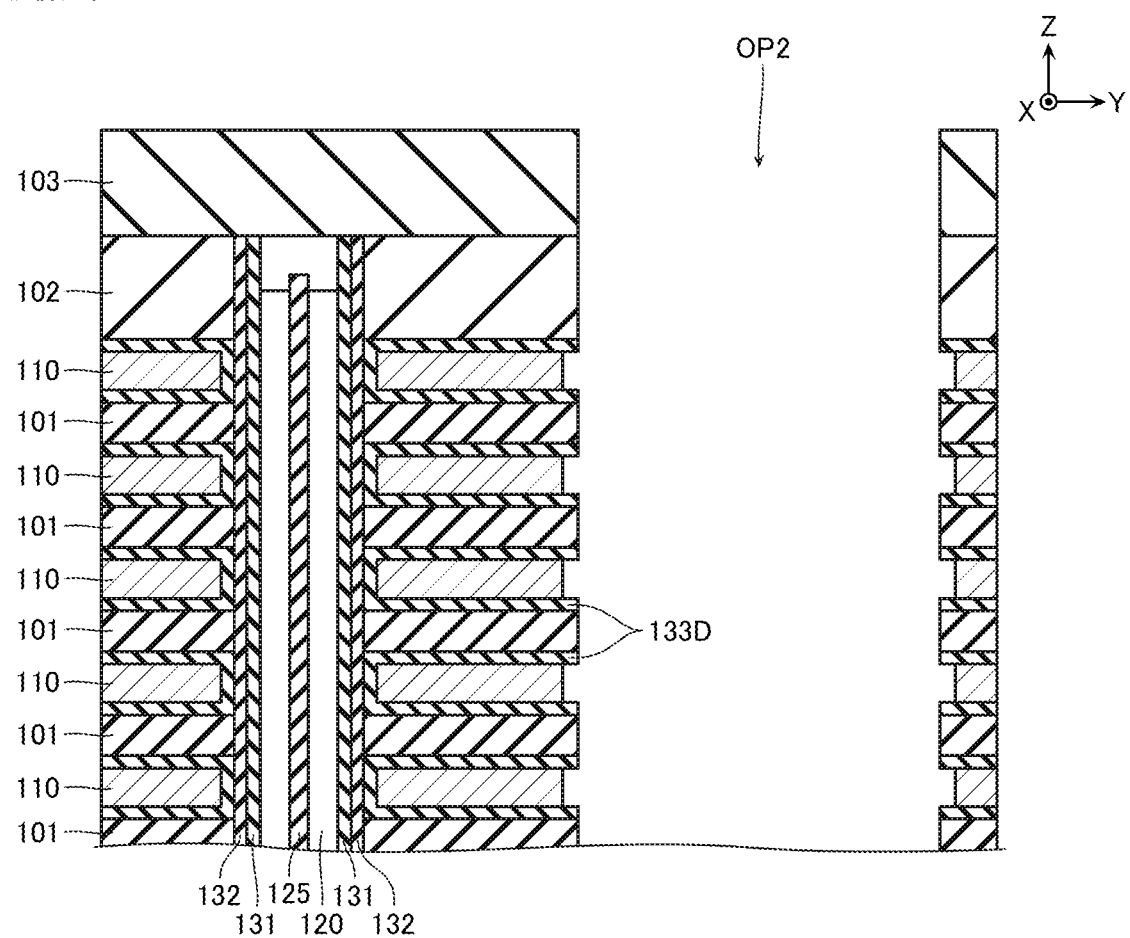
FIG. 31 is a schematic Y-Z cross-sectional view illustrating a manufacturing method of a semiconductor memory device according to a second comparative example.

Next, as illustrated in FIG. 31, in the conductive layers 110, the conductive layers 110 formed on the upper surfaces of the insulating layers 103, the side surfaces of the insulating layers 102, 103, the side surfaces of the insulating layers 101, and the like are removed by dry etching or the like using a chlorine ($Cl_2$)-based gas. Additionally, the metal oxide films 133D formed on the upper surfaces of the insulating layers 103, the side surfaces of the insulating layers 102, 103, and the side surfaces of the insulating layers 101 are removed.

Since the metal oxide films 133D formed on the side surfaces of the insulating layers 101 are thus removed, the molybdenum (Mo) film formed on the surfaces of the metal oxide films 133D (the surfaces on the opening OP2 side) made of aluminum oxide ($Al_2O_3$) formed on the side surfaces of the insulating layers 101 is also removed.

In view of this, the problem in the manufacturing method of the first comparative example, that is, a possibility that the two conductive layers 110 adjacent in the Z-direction are electrically connected via the molybdenum (Mo) remaining in the crystal grain boundary in the metal oxide film 133D is eliminated.

Figure 32:
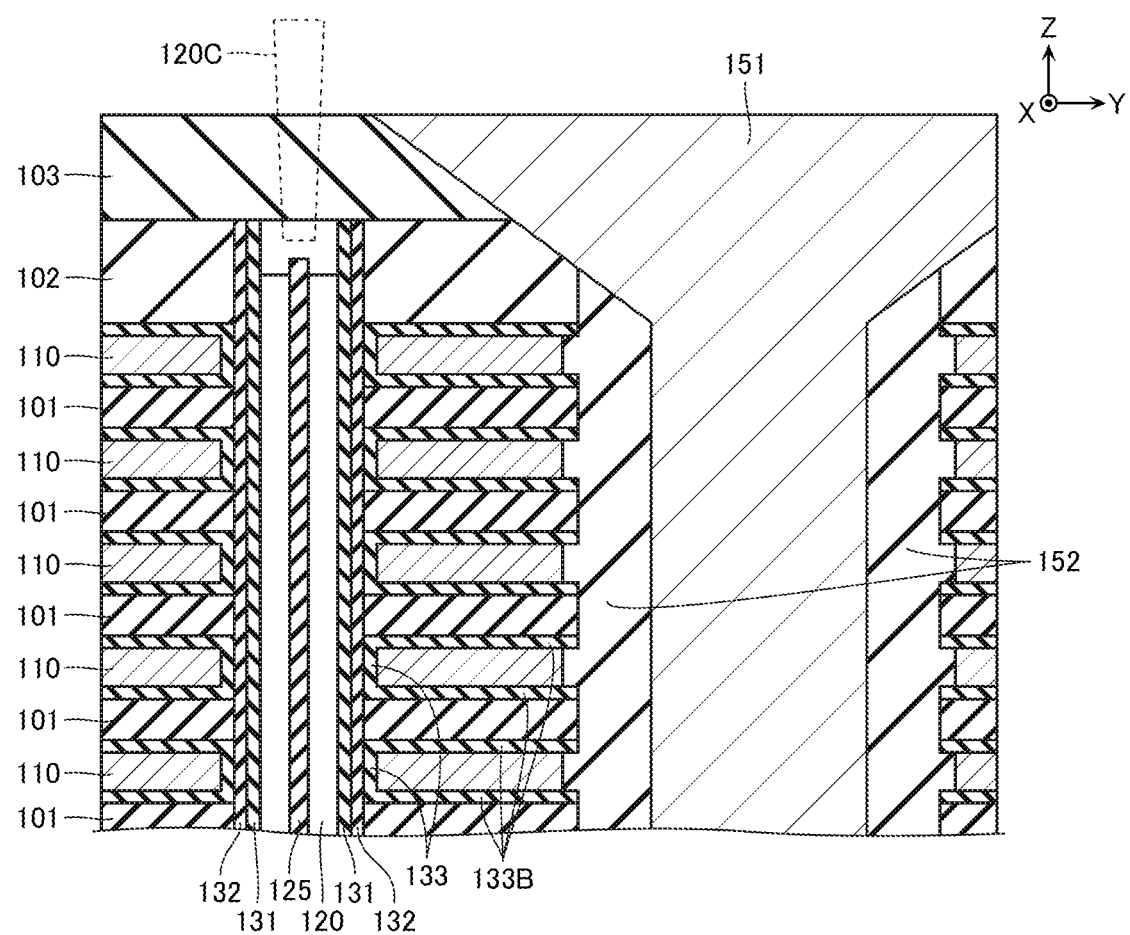
FIG. 32 is a schematic Y-Z cross-sectional view illustrating the manufacturing method of the semiconductor memory device according to the second comparative example.

Next, as illustrated in FIG. 32, the insulating layers 152 are formed on the inner surface and the bottom surface of the opening OP2. Afterwards, the insulating layer 152 on the bottom surface part of the opening OP2 is removed by anisotropic etching, such as RIE. When this anisotropic etching is performed, there may be a case where lateral (Y-direction) etching proceeds also in the upper side part of the opening OP2, the insulating layers 102, 103 made of silicon oxide ($SiO_2$) or the like are also removed, and an opening width expands in the Y-direction in the upper side part of the opening OP2.

Thus, while the opening width expands in the Y-direction in the upper side part of the opening OP2, when the conductive layer 151 is formed by forming the tungsten (W) film or the like, there may be a case where the conductive layer 151 has a shape expanding in the Y-direction in the upper side part.

Afterwards, when the contact 120C is formed, the contact 120C possibly shorts with the conductive layer 151, which expands in the Y-direction.

Effects of First Embodiment

In the first embodiment, for example, in the process described with reference to FIG. 13, the metal oxide films 133D made of aluminum oxide ($Al_2O_3$) formed on the side surfaces of the insulating layers 101 are removed together with the molybdenum (Mo) film formed in the crystal grain boundaries. In view of this, the problem that the two conductive layers 110 adjacent in the Z-direction are electrically connected via the remaining molybdenum (Mo) to short is reduced, and insulation between these two conductive layers 110 can be ensured.

In this embodiment, when the part of the insulating layer 152 covering the bottom surface of the opening OP2 is removed by anisotropic etching, such as RIE, the etching stoppers 133A serve as the masks. Therefore, the progress of the lateral (Y-direction) etching is reduced in the upper side part of the opening OP2, and the expansion of the opening width in the upper side part of the opening OP2 can be reduced.

Accordingly, the expansion in the Y-direction of the conductive layer 151 can be reduced and the short between the contact 120C and the conductive layer 151 can be reduced.

Second Embodiment

Next, a configuration of a semiconductor memory device according to the second embodiment will be described with reference to the drawings. Note that, in the following description, same reference numerals are given to configuration parts similar to those of the first embodiment and description thereof will be simplified and omitted.

[Structure]

Figure 33:
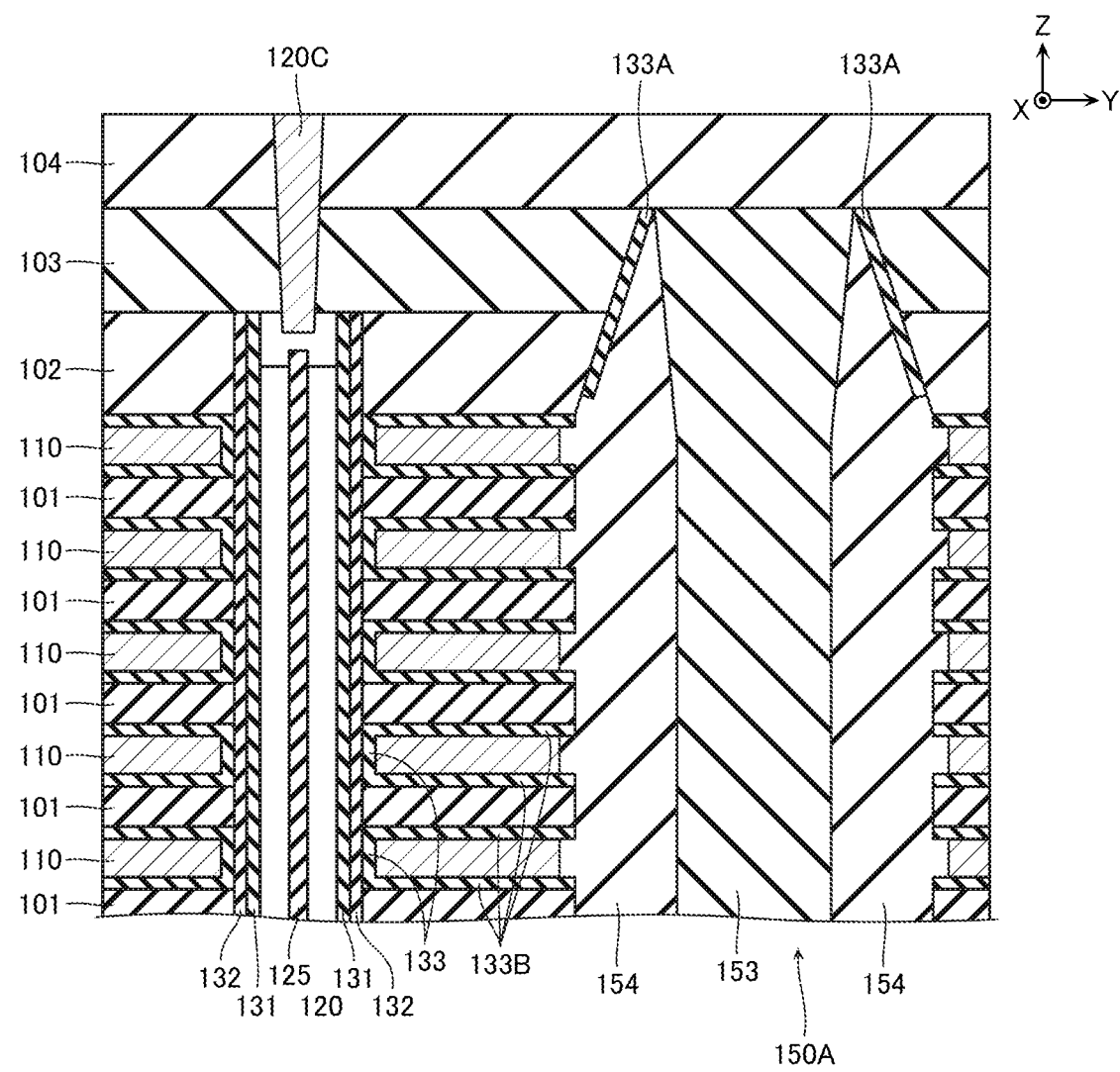
FIG. 33 is a schematic cross-sectional view illustrating a configuration of a semiconductor memory device according to a second embodiment.

FIG. 33 is a schematic cross-sectional view illustrating the main parts of the semiconductor memory device according to the second embodiment. In the second embodiment, a structure of an inter-block structure 150A and an arrangement state of the etching stopper 133A differ from the structure of the inter-block structure 150 and the arrangement state of the etching stopper 133A according to the first embodiment, which are illustrated in FIG. 2, FIG. 4, and the like.

In the second embodiment, the inter-block structure 150A includes, for example, an insulating layer 153 that extends in the Z-direction and the Y-direction, and a pair of respective insulating layers 154 disposed on side surfaces of the insulating layer 153. The insulating layers 153, 154 are made of an insulating material, such as silicon oxide ($SiO_2$).

For example, the inter-block structure 150A has the Y-direction width at the upper side part narrower than the Y-direction width of the lower portion.

The pair of insulating layers 154 separated in the Y-direction with the insulating layer 153 therebetween has the upper side part where the Y-direction width gradually decreases along the Z-direction from below toward above.

The etching stoppers 133A are disposed on the side surfaces on the inter-block structure 150A side among the side surfaces of the insulating layer 102 and the insulating layer 103. In the second embodiment, for example, among the side surfaces of the insulating layers 102, 103, the side surfaces on the inter-block structure 150A side are inclined. That is, between the side surfaces of the insulating layers 102, 103 separated in the Y-direction with the inter-block structure 150A therebetween are inclined surfaces that gradually approach along the Z-direction from below toward above. In view of this, the pair of the etching stoppers 133A disposed on the side surfaces of the insulating layers 102, 103 are disposed to be inclined so as to gradually approach along the Z-direction from below toward above.

In this embodiment, the upper surface of the inter-block structure 150A, that is, the upper surface of the insulating layer 153 is flat, and the upper surface of the insulating layer 153 and the upper surfaces of the insulating layers 103 form continuous planes.

[Manufacturing Method of Semiconductor Memory Device According to Second Embodiment]

Next, the gist of an example of the manufacturing method of the semiconductor memory device according to the second embodiment will be described.

First, similarly to the first manufacturing method of the semiconductor memory device according to the first embodiment, the processes described with reference to FIG. 5 to FIG. 7 are performed.

Figure 34:
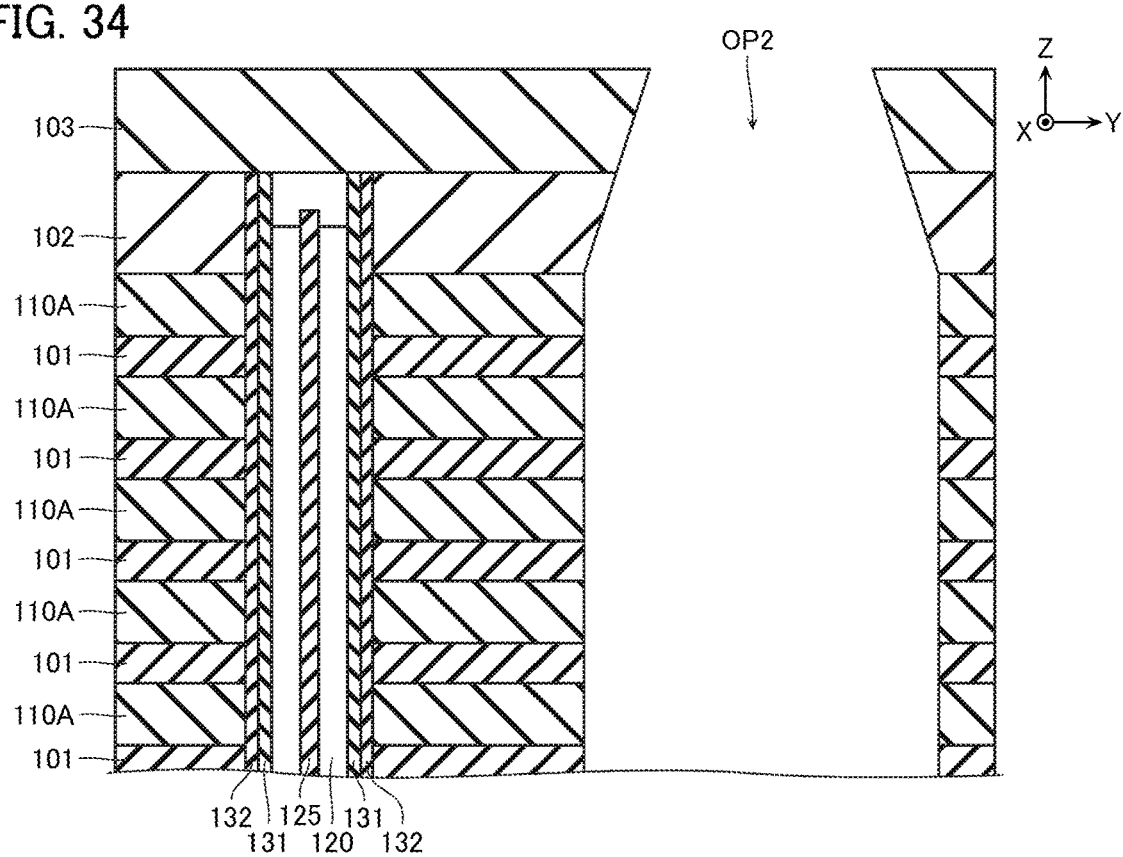
FIG. 34 is a schematic Y-Z cross-sectional view illustrating a manufacturing method of the semiconductor memory device according to the second embodiment.

Next, for example, as illustrated in FIG. 34, similarly to the process described with reference to FIG. 8, the opening OP2 is formed. However, in the second embodiment, the opening OP2 is formed such that the Y-direction width of the upper side part is narrower than the Y-direction width of the portion lower than that. In view of this, among the side surfaces of the insulating layers 102, 103, the side surfaces on the opening OP2 side are inclined surfaces.

Figure 35:
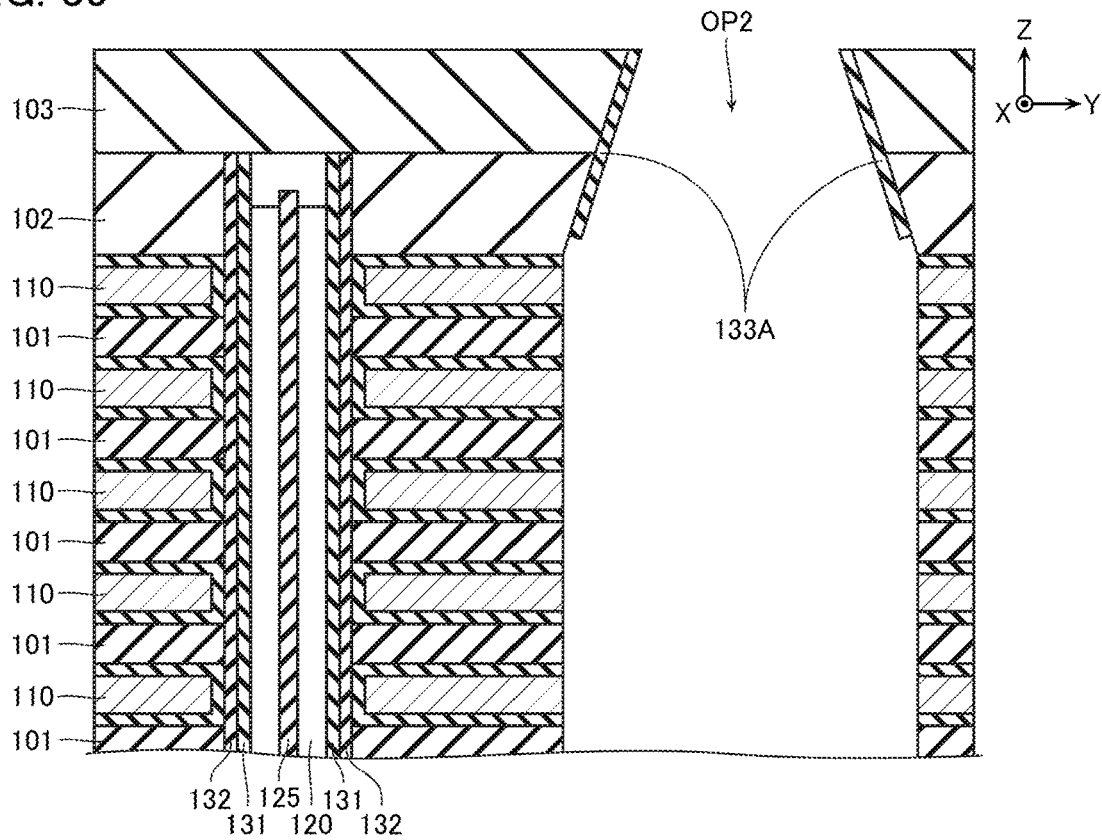
FIG. 35 is a schematic Y-Z cross-sectional view illustrating the manufacturing method of the semiconductor memory device according to the second embodiment.

Next, for example, as illustrated in FIG. 35, by performing the processes described with reference to FIG. 9 to FIG. 15, the etching stoppers 133A are formed on the inclined side surfaces on the opening OP2 side among the side surfaces of the insulating layers 102, 103.

Figure 36:
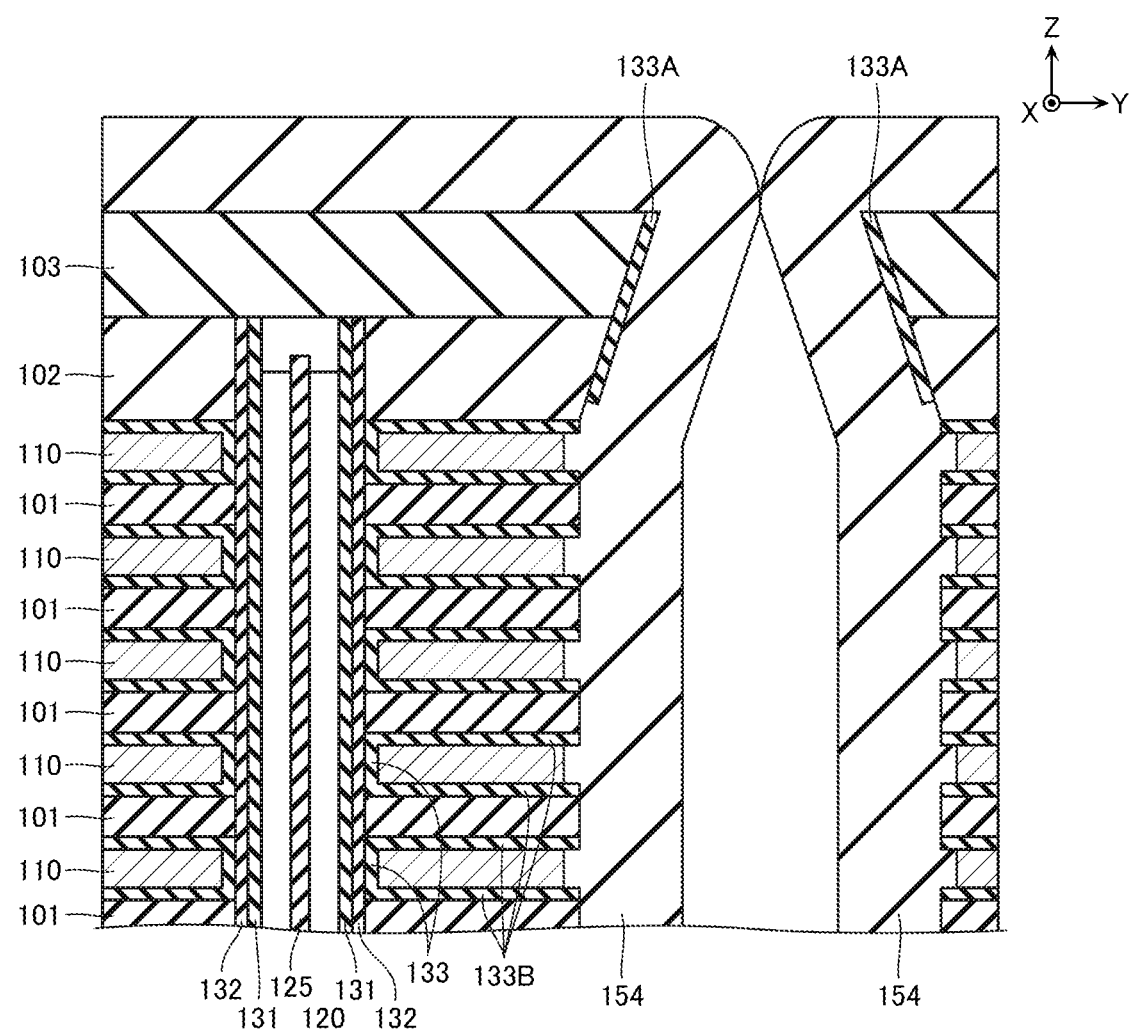
FIG. 36 is a schematic Y-Z cross-sectional view illustrating the manufacturing method of the semiconductor memory device according to the second embodiment.

Next, for example, as illustrated in FIG. 36, the insulating layers 154 are formed by forming a silicon oxide ($SiO_2$) film or the like on the inner surface of the opening OP2 (the side surfaces of the conductive layers 110, the insulating layers 101, and the etching stoppers 133A) and the bottom surface of the opening OP2 (the upper surface of the semiconductor substrate 100) by means such as CVD. At this time, since the Y-direction width of the upper side part of the opening OP2 is narrow, the upper side part of one insulating layer 154 overlaps with the upper side part of the other insulating layer 154, and thus the upper side part of the opening OP2 is obstructed with both overlapped insulating layers 154. Note that in the portion lower than the upper side part of the opening OP2, a clearance (a cavity) is formed between the one insulating layer 154 and the other insulating layer 154.

Figure 37:
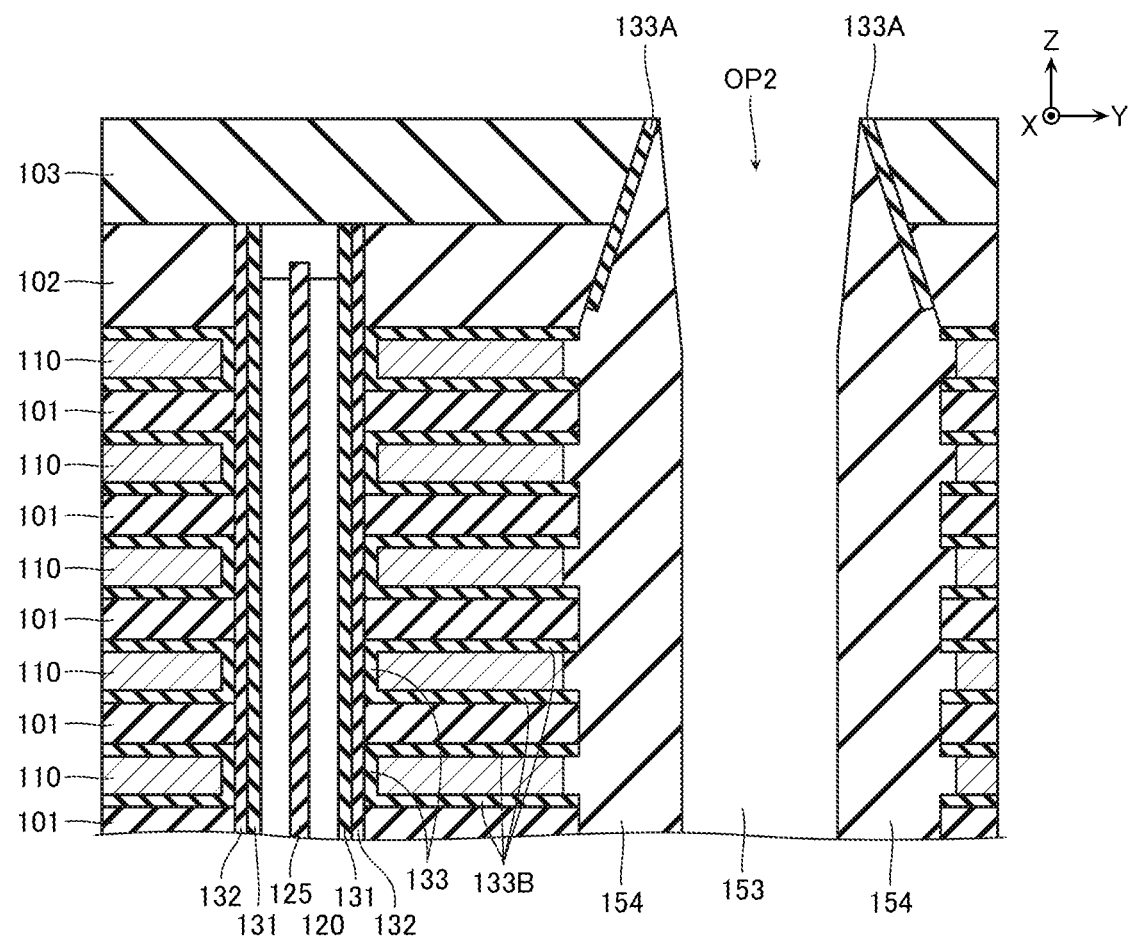
FIG. 37 is a schematic Y-Z cross-sectional view illustrating the manufacturing method of the semiconductor memory device according to the second embodiment.

Next, for example, as illustrated in FIG. 37, a part of the upper side parts of the insulating layers 154 obstructing the upper side part of the opening OP2 are removed by anisotropic etching, such as RIE. Thus, the clearance (the cavity) formed between the one insulating layer 154 and the other insulating layer 154 becomes an open state in the upper side part.

Here, when the upper side parts of the insulating layers 154 that obstruct the upper side part of the opening OP2 are removed by anisotropic etching, such as RIE, the etching stoppers 133A where the etching rate is low (the etching resistance is high) serve as masks. Consequently, lateral (Y-direction) etching does not proceed in the upper side part of the opening OP2. Accordingly, this method allows selectively removing the upper side parts of the insulating layers 154 that obstruct the upper side part of the opening OP2 without removing the insulating layers 102, 103 made of silicon oxide ($SiO_2$) or the like by etching, such as RIE.

Figure 38:
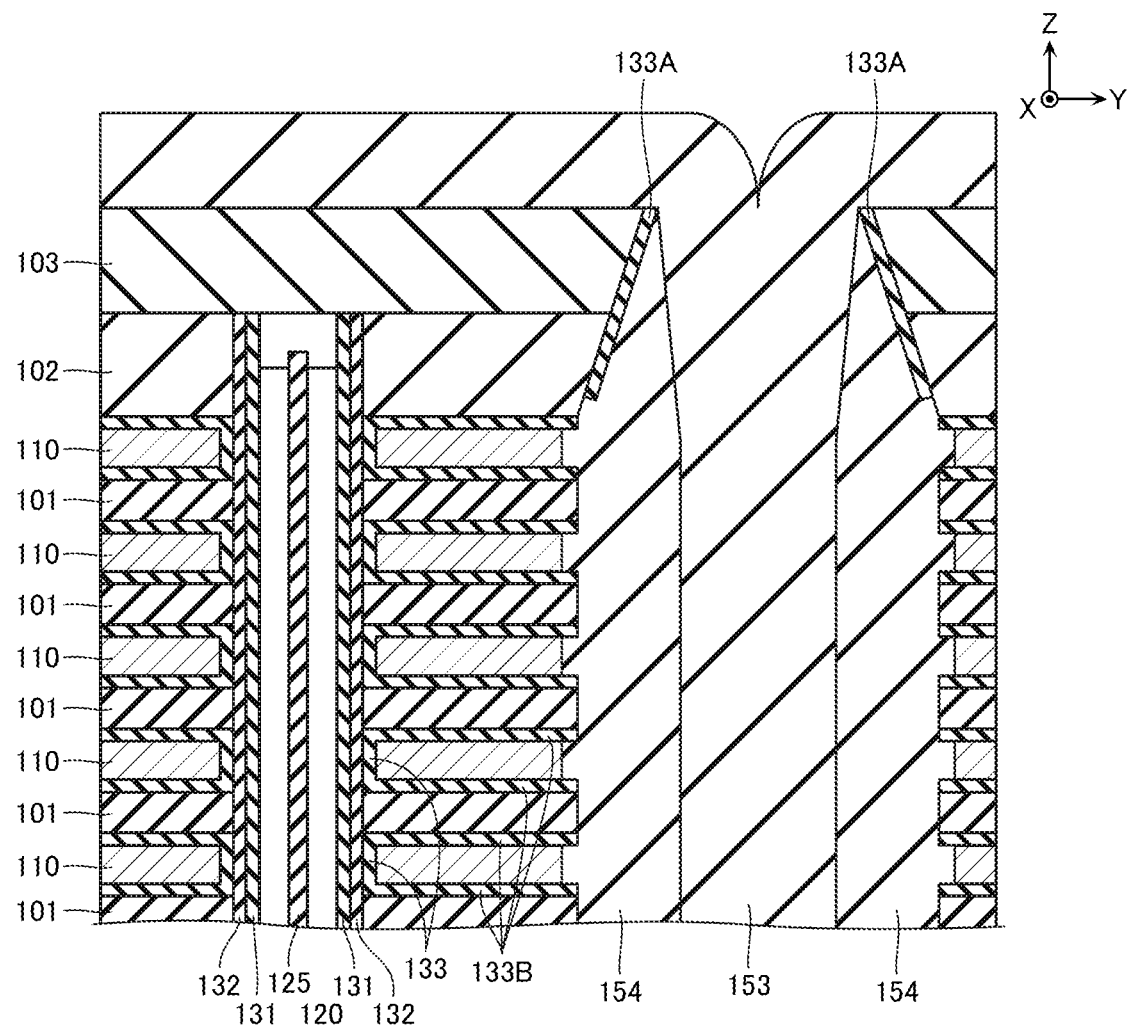
FIG. 38 is a schematic Y-Z cross-sectional view illustrating the manufacturing method of the semiconductor memory device according to the second embodiment.

Next, for example, as illustrated in FIG. 38, a silicon oxide ($SiO_2$) film or the like is formed in the clearance (the cavity) formed between the one insulating layer 154 and the other insulating layer 154 from the upper side part of the opening OP2 in the open state by means such as CVD, to form the insulating layer 153. At this time, the insulating layer 153 is also formed on the upper surfaces of the insulating layers 103.

Afterwards, by removing the insulating layer 153 formed on the upper surfaces of the insulating layers 103 and forming the insulating layer 104 and the contact 120C, the semiconductor memory device according to the second embodiment is manufactured.

Third Comparative Example

Next, with reference to FIG. 39 a configuration of a semiconductor memory device according to the third comparative example will be described. Note that, same reference numerals are given to configuration parts similar to those of the second embodiment and description thereof will be simplified and omitted.

Figure 39:
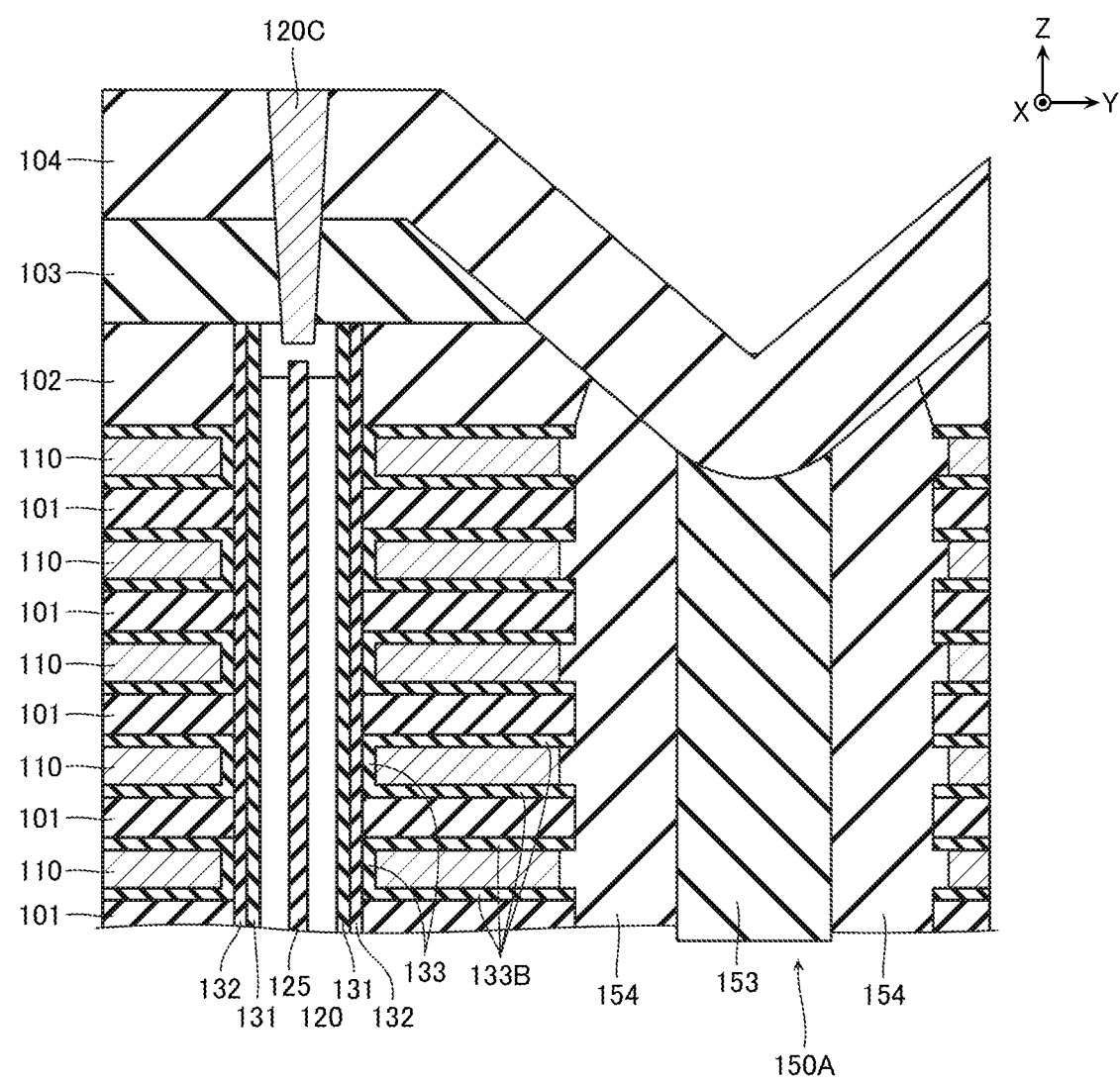
FIG. 39 is a schematic cross-sectional view illustrating a configuration of a semiconductor memory device according to a third comparative example.

As illustrated in FIG. 39, the semiconductor memory device according to the third comparative example does not include the etching stoppers 133A included in the semiconductor memory device according to the second embodiment. Additionally, the upper surface of the inter-block structure 150A (the insulating layer 153) is recessed, the insulating layer 104 gets into this recessed portion, and the upper surface of the insulating layer 104 is also recessed.

The reason that the recessed portions are provided on the upper surfaces of the inter-block structure 150A and the insulating layer 104 is as follows.

That is, as described with reference to FIG. 36, when the insulating layers 154 are formed on the inner surface and the bottom surface of the opening OP2 in which the Y-direction width of the upper side part is narrower than the Y-direction width of the portion lower than that, the upper side parts of both insulating layers 154 overlap, and thus the upper side part of the opening OP2 is obstructed.

Therefore, in the manufacturing method according to the second embodiment, as described with reference to FIG. 37, the upper side parts of the insulating layers 154 that obstruct the upper side part of the opening OP2 are removed by anisotropic etching, such as RIE. In this respect, the lateral (Y-direction) expansion of the opening OP2 is reduced by the etching stoppers 133A.

Figure 40:
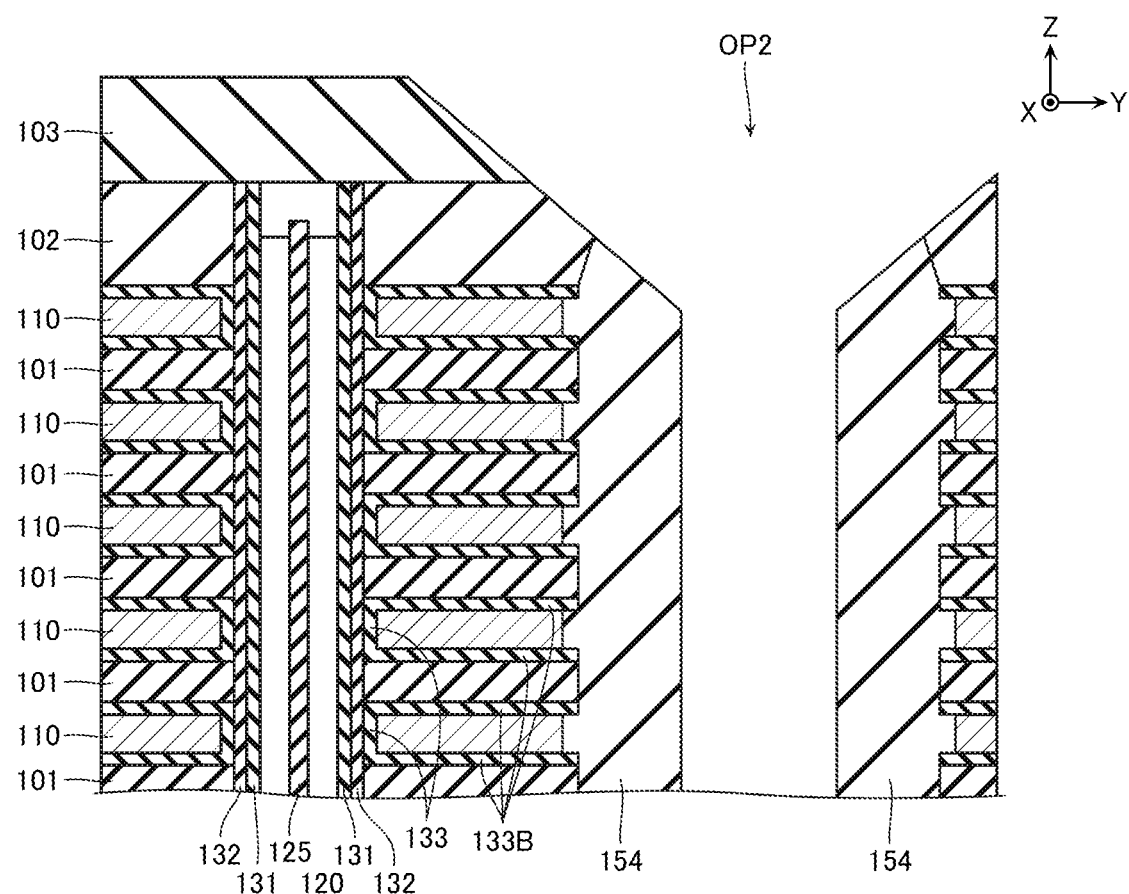
FIG. 40 is a schematic Y-Z cross-sectional view illustrating a manufacturing method of the semiconductor memory device according to the third comparative example.

Here, in the case where the etching stoppers 133A are absent in the opening OP2, for example, as illustrated in FIG. 40, the lateral (Y-direction) etching proceeds also in the upper side part of the opening OP2, the insulating layers 154 and the insulating layers 102, 103 made of silicon oxide ($SiO_2$) or the like are also removed, and thus the opening width expands in the Y-direction in the upper side part of the opening OP2.

Figure 41:
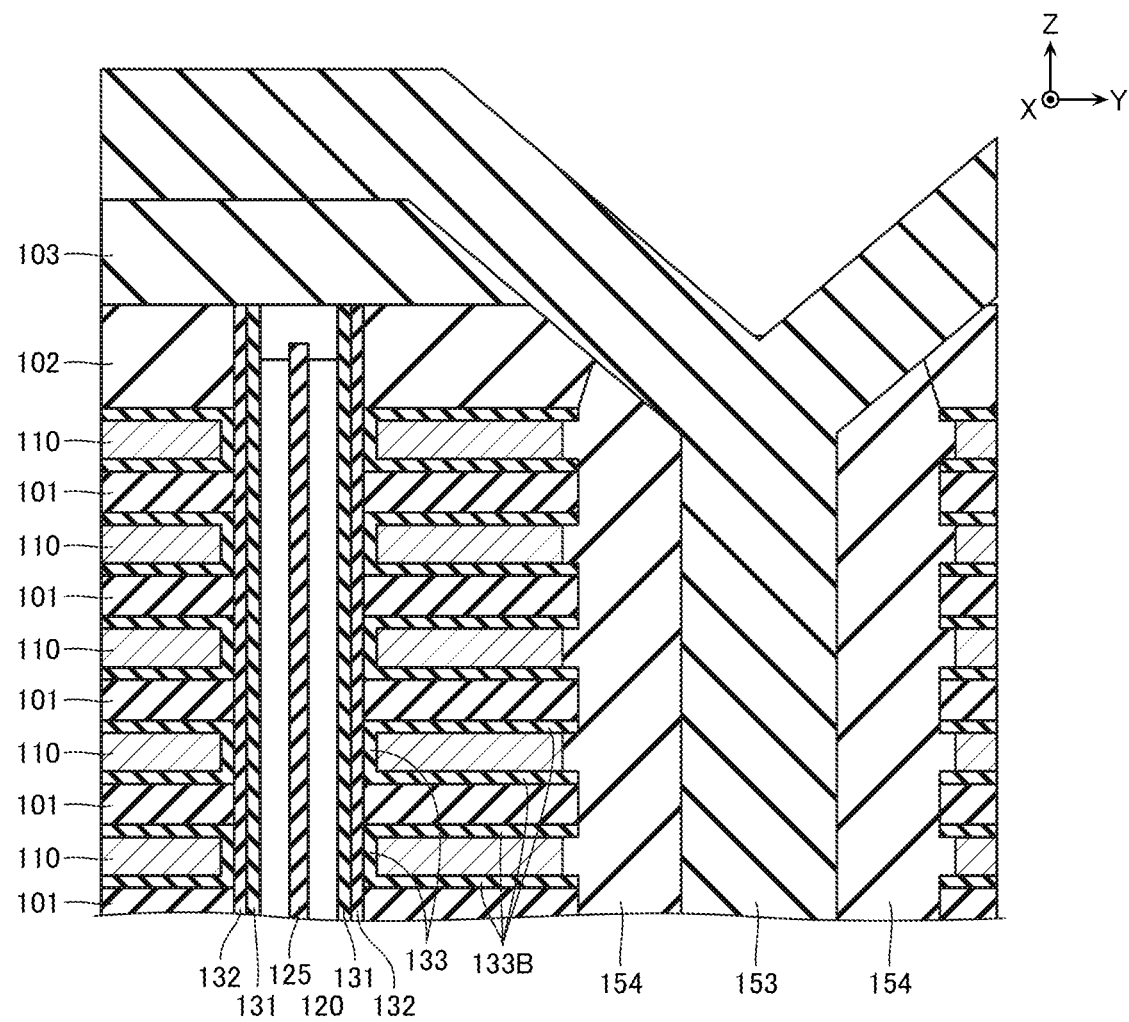
FIG. 41 is a schematic Y-Z cross-sectional view illustrating the manufacturing method of the semiconductor memory device according to the third comparative example.

Thus, in the state where the opening width expands in the Y-direction in the upper side part of the opening OP2, when the insulating layer 153 is formed by forming a silicon oxide ($SiO_2$) film or the like in the clearance (the cavity) formed between the one insulating layer 154 and the other insulating layer 154 from the upper side part of the opening OP2 by means such as CVD, for example, as illustrated in FIG. 41, the upper surface of the insulating layer 153 is recessed. This is because, since a filling amount of the silicon oxide ($SiO_2$) or the like, which becomes the insulating layer 153, is set under a condition that the opening width of the opening OP2 does not expand in the Y-direction, when the opening width of the opening OP2 expands in the Y-direction, the silicon oxide ($SiO_2$) or the like is unnecessarily used by the amount of filling the expanded part, and as a result, the upper surface of the insulating layer 153 is recessed.

Thus, when the upper surface of the insulating layer 153 is recessed, the upper surface of the insulating layer 104 formed on this insulating layer 153 is also recessed. In view of this, for example, a wiring layer or the like formed above the insulating layer 104 is recessed, and this possibly fails to appropriately form the wiring layer or the like.

Effects of Second Embodiment

In the second embodiment, the upper surface of the inter-block structure 150A, that is, the upper surfaces of the insulating layers 153, 154 are flat, and therefore the upper surface of the insulating layer 104 is also flat. In view of this, for example, the wiring layer or the like formed above the insulating layer 104 can be appropriately formed.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate;
a plurality of first conductive layers and a plurality of first insulating layers stacked in alternation in a first direction intersecting with a surface of the substrate;
a first semiconductor layer that extends in the first direction and is opposed to the plurality of first conductive layers and the plurality of first insulating layers;
a second semiconductor layer that is connected to one end portion in the first direction of the first semiconductor layer and extends in a second direction intersecting with the first direction;
a second insulating layer that covers an outer peripheral surface of another end portion of the first semiconductor layer; and
a third insulating layer disposed at a position in the second direction different from the plurality of first conductive layers, the plurality of first insulating layers, and the second insulating layer, the third insulating layer extending in the first direction, the third insulating layer having one end in the first direction in contact with the second semiconductor, the third insulating layer having another end in the first direction farther from the second semiconductor layer than the second insulating layer, wherein
a metal oxide film is disposed on a surface on the third insulating layer side in the second direction of the second insulating layer, and
a metal oxide film is absent on a surface on the third insulating layer side in the second direction of the plurality of first insulating layers.

2. The semiconductor memory device according to claim 1, comprising:
an electric charge accumulating film disposed between the plurality of first conductive layers and the first semiconductor layer; and
a plurality of first metal oxide films disposed between the plurality of first conductive layers and the electric charge accumulating film.

3. The semiconductor memory device according to claim 2, comprising
a plurality of second metal oxide films disposed between the plurality of first conductive layers and the plurality of first insulating layers, the plurality of second metal oxide films being continuously formed with the first metal oxide film.

4. The semiconductor memory device according to claim 3, wherein
the metal oxide film disposed on the surface on the third insulating layer side in the second direction of the second insulating layer is separated from all of the plurality of second metal oxide films in the first direction.

5. The semiconductor memory device according to claim 3, wherein
the first metal oxide film and the second metal oxide film contain aluminum (Al).

6. The semiconductor memory device according to claim 3, wherein one of the plurality of first conductive layers is assumed to be a third conductive layer, and one of the plurality of second metal oxide films is assumed to be a third metal oxide film:
the third conductive layer includes a metal layer containing molybdenum (Mo), tungsten (W), or ruthenium (Ru); and
the third metal oxide film is in contact with a surface at one side in the first direction of the metal layer.

7. The semiconductor memory device according to claim 1, wherein
the substrate is a semiconductor substrate, and
the second semiconductor layer is a part of the semiconductor substrate.

8. The semiconductor memory device according to claim 1, comprising
a second conductive layer that extends in the first direction, has one end in the first direction in contact with the second semiconductor layer, and has another end in the first direction farther from the second semiconductor layer than the second insulating layer, wherein
the second conductive layer is in contact with the third insulating layer in the second direction.

9. The semiconductor memory device according to claim 1, wherein
the metal oxide film contains aluminum (Al).

10. A semiconductor memory device comprising:
a substrate;
a plurality of first conductive layers and a plurality of first insulating layers stacked in alternation in a first direction intersecting with a surface of the substrate;
a first semiconductor layer that extends in the first direction and is opposed to the plurality of first conductive layers and the plurality of first insulating layers;
a second semiconductor layer that is connected to one end portion in the first direction of the first semiconductor layer and extends in a second direction intersecting with the first direction;
a first contact that is connected to another end portion in the first direction of the first semiconductor layer and extends in the first direction;
a second insulating layer that covers at least a part of an outer peripheral surface of the first contact; and
a third insulating layer disposed at a position in the second direction different from the plurality of first conductive layers, the plurality of first insulating layers, the first contact, and the second insulating layer, the third insulating layer extending in the first direction, the third insulating layer having one end in the first direction in contact with the second semiconductor, the third insulating layer having another end in the first direction farther from the second semiconductor layer than the plurality of first conductive layers, wherein
a metal oxide film is disposed on a surface on the third insulating layer side in the second direction of the second insulating layer, and
a metal oxide film is absent on a surface on the third insulating layer side in the second direction of the plurality of first insulating layers.

11. The semiconductor memory device according to claim 10, comprising:
an electric charge accumulating film disposed between the plurality of first conductive layers and the first semiconductor layer; and
a plurality of first metal oxide films disposed between the plurality of first conductive layers and the electric charge accumulating film.

12. The semiconductor memory device according to claim 11, comprising
a plurality of second metal oxide films disposed between the plurality of first conductive layers and the plurality of first insulating layers, the plurality of second metal oxide films being continuously formed with the first metal oxide film.

13. The semiconductor memory device according to claim 12, wherein
the metal oxide film disposed on the surface on the third insulating layer side in the second direction of the second insulating layer is separated from all of the plurality of second metal oxide films in the first direction.

14. The semiconductor memory device according to claim 12, wherein
the first metal oxide film and the second metal oxide film contain aluminum (Al).

15. The semiconductor memory device according to claim 12, wherein
one of the plurality of first conductive layers is assumed to be a third conductive layer, and one of the plurality of second metal oxide films is assumed to be a third metal oxide film:

the third conductive layer includes a metal layer containing molybdenum (Mo), tungsten (W), or ruthenium (Ru); and
the third metal oxide film is in contact with a surface at one side in the first direction of the metal layer.

16. The semiconductor memory device according to claim 10, wherein
the substrate is a semiconductor substrate, and
the second semiconductor layer is a part of the semiconductor substrate.

17. The semiconductor memory device according to claim 10, comprising
a second conductive layer that extends in the first direction, has one end in the first direction in contact with the second semiconductor layer, and has another end in the first direction farther from the second semiconductor layer than the plurality of first conductive layers, wherein
the second conductive layer is in contact with the third insulating layer in the second direction.

18. The semiconductor memory device according to claim 10, wherein
the metal oxide film contains aluminum (Al).

* * * * *